United States Patent
Kawaguchi et al.

(10) Patent No.: US 11,181,225 B2
(45) Date of Patent: Nov. 23, 2021

(54) ATTACHMENT DEVICE, ELECTRONIC DEVICE, ATTACHMENT DEVICE SECURING METHOD, AND SHEET

(71) Applicant: Panasonic Intellectual Property Management Co., Ltd., Osaka (JP)

(72) Inventors: Satoshi Kawaguchi, Osaka (JP); Akira Taniguchi, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 56 days.

(21) Appl. No.: 16/467,089

(22) PCT Filed: Dec. 11, 2017

(86) PCT No.: PCT/JP2017/044293
§ 371 (c)(1),
(2) Date: Jun. 6, 2019

(87) PCT Pub. No.: WO2018/116877
PCT Pub. Date: Jun. 28, 2018

(65) Prior Publication Data
US 2019/0316730 A1  Oct. 17, 2019

(30) Foreign Application Priority Data

Dec. 19, 2016  (JP) .............................. JP2016-245051
Dec. 19, 2016  (JP) .............................. JP2016-245052

(51) Int. Cl.
*F16M 11/12* (2006.01)
*H05K 5/02* (2006.01)

(52) U.S. Cl.
CPC ........... *F16M 11/12* (2013.01); *H05K 5/0221* (2013.01); *H05K 5/0234* (2013.01)

(58) Field of Classification Search
CPC ...... F16M 11/12; H05K 5/221; H05K 5/0234; F16B 5/0621; F16B 5/0607
(Continued)

(56) References Cited

U.S. PATENT DOCUMENTS 2,288,439 A    6/1942 Axel
D137,340 S *   2/1944 Lozier ........................... D10/64
(Continued)

FOREIGN PATENT DOCUMENTS

JP    53-147610 U    11/1978
JP    62-078181 U    5/1987
(Continued)

OTHER PUBLICATIONS https://www.prettyhandygirl.com/wall-mounted-tv-with-hidden-wires-tutorial-ggnoads/, pp. 1-10, Jun. 22, 2015 (Year: 2015).*
(Continued)

*Primary Examiner* — Kimberly T Wood
(74) *Attorney, Agent, or Firm* — McDermott Will and Emery LLP

(57) ABSTRACT

An attachment device is an attachment device for attaching an electronic device body to a wall surface, and includes a base having a plurality of pin holes, a plurality of pins that are respectively inserted in the pin holes, and secure the base to the wall surface, and a locking part that is secured to the base, and on which the electronic device body is to be hung and locked. The base includes a securing surface that is a surface to be secured to the wall surface, and the pin holes are arranged outwardly from the base at a predetermined angle with respect to the securing surface.

6 Claims, 17 Drawing Sheets

(58) Field of Classification Search
USPC ....... 33/613, 666; 248/301, 303, 304, 309.1,
248/309.2, 220.2, 220.22, 225.11, 225.21,
248/322, 328, 339, 223.41, 689, 686, 690,
248/692, 675, 215, 224.8, 300, 200, 917,
248/924, 918, 220.21, 220.11, 220.42,
248/220.13, 221.11, 222.51, 222.52
See application file for complete search history.

(56) References Cited

U.S. PATENT DOCUMENTS

| | | | | |
|---|---|---|---|---|
| 3,795,983 | A * | 3/1974 | Gallagher | G01B 3/00 33/666 |
| 4,094,490 | A * | 6/1978 | Einhorn | A47G 1/20 248/304 |
| 4,686,769 | A * | 8/1987 | Rock | E05B 17/06 33/197 |
| 4,795,294 | A * | 1/1989 | Takada | A47G 1/22 411/457 |
| 5,107,601 | A | 4/1992 | Semchuck | |
| 5,709,059 | A * | 1/1998 | Murphy | F16B 43/00 52/410 |
| 6,077,000 | A * | 6/2000 | Gibbons | B23B 47/28 33/529 |
| 6,367,224 | B1 * | 4/2002 | Leek | F16B 12/46 52/704 |
| 7,040,034 | B2 | 5/2006 | Nielson | B25H 7/00 33/574 |
| 7,108,237 | B2 * | 9/2006 | Gauselmann | G07F 9/10 248/220.22 |
| 7,181,859 | B2 * | 2/2007 | Lai | B65D 5/4229 33/1 B |
| 7,290,743 | B2 * | 11/2007 | Nowack | A47G 1/22 248/216.1 |
| 7,421,796 | B1 * | 9/2008 | DeAngelis-Morris | A47G 1/205 33/1 B |
| 7,497,028 | B2 * | 3/2009 | Nevers | A47G 1/1606 33/613 |
| 7,856,732 | B2 * | 12/2010 | Townsend | A47G 1/205 33/613 |
| 8,250,774 | B2 * | 8/2012 | Townsend | F16M 13/02 33/613 |
| 9,080,713 | B2 * | 7/2015 | Lucas | H05K 5/0204 |
| 9,158,182 | B1 * | 10/2015 | Lewin | H04N 5/2252 |
| 2003/0154614 | A1 * | 8/2003 | Rice | A47G 1/205 33/613 |
| 2004/0142752 | A1 * | 7/2004 | Gauselmann | G07F 17/32 463/46 |
| 2005/0016122 | A1 * | 1/2005 | Lai | B65D 5/4229 52/749.1 |
| 2006/0101661 | A1 * | 5/2006 | Schmidt | A47G 1/205 33/613 |
| 2006/0266900 | A1 * | 11/2006 | May | A47B 96/06 248/220.22 |
| 2007/0194191 | A1 * | 8/2007 | Persson | F16M 13/02 248/225.11 |
| 2009/0108149 | A1 * | 4/2009 | Goto | B60N 3/103 248/205.1 |
| 2010/0242827 | A1 * | 9/2010 | Rodriguez | B63B 45/08 114/343 |
| 2011/0146163 | A1 * | 6/2011 | Naroditsky | H05K 5/0204 52/27 |
| 2011/0297810 | A1 | 12/2011 | Tachibana | |
| 2011/0303810 | A1 * | 12/2011 | Xue | F16M 11/10 248/220.22 |
| 2012/0012726 | A1 * | 1/2012 | Daniels | A47G 25/0678 248/304 |
| 2012/0056051 | A1 * | 3/2012 | Gold | A47G 25/0607 248/222.14 |
| 2013/0270407 | A1 * | 10/2013 | Oh | F16M 13/02 248/220.22 |
| 2013/0306816 | A1 | 11/2013 | Yoshida | |
| 2014/0096404 | A1 | 4/2014 | Chen | |
| 2014/0110548 | A1 * | 4/2014 | Martin | A47B 81/06 248/309.1 |
| 2015/0070594 | A1 * | 3/2015 | Trachtenberg | H04N 5/64 348/841 |

FOREIGN PATENT DOCUMENTS

| | | |
|---|---|---|
| JP | 10-232050 | 9/1998 |
| JP | 11-184395 | 7/1999 |
| JP | 2002-106955 | 4/2002 |
| JP | 2006-313220 | 11/2006 |
| JP | 2011-149453 | 8/2011 |
| JP | 2014-077450 | 5/2014 |
| JP | 5501866 B | 5/2014 |

OTHER PUBLICATIONS

International Search Report of PCT application No. PCT/JP2017/044293 dated Mar. 13, 2018.
The Extended European Search Report dated Nov. 12, 2019 for the related European Patent Application No. 17884592.1.

* cited by examiner

ATTACHMENT DEVICE, ELECTRONIC DEVICE, ATTACHMENT DEVICE SECURING METHOD, AND SHEET

CROSS-REFERENCE TO RELATED APPLICATIONS

This application is a U.S. national stage application of the PCT International Application No. PCT/JP2017/044293 filed on Dec. 11, 2017, which claims the benefit of foreign priority of Japanese patent applications No. 2016-245051 filed on Dec. 19, 2016 and No. 2016-245052 filed on Dec. 19, 2016, the contents all of which are incorporated herein by reference.

TECHNICAL FIELD

The present disclosure relates to an attachment device for attaching an electronic device body to a wall surface, an electronic device including the attachment device, a method of securing a plurality of the attachment devices to a wall surface, and a sheet used for securing the attachment device to the wall surface.

BACKGROUND ART

PTL 1 discloses a mounting bracket. The mounting bracket enables a user to mount an electronic device body, for example, on a bar attached to a desk.

PTL 2 discloses an attachment device. The attachment device enables a user to attach an electronic device body to a wall surface. The attachment device also enables a user to adjust the position of the electronic device body attached to the wall surface.

CITATION LIST

Patent Literature

PTL 1: Unexamined Japanese Patent Publication No. 2011-149453

PTL 2: Japanese Patent No. 5501866

SUMMARY

The present disclosure provides an attachment device that enables a user to easily attach an electronic device body to a wall surface, and an electronic device including the attachment device.

The present disclosure also provides an attachment device securing method that enables a user to easily secure a plurality of the attachment devices to a wall surface while the attachment devices are aligned in a horizontal direction when an electronic device body is to be attached to the wall surface by using the attachment devices, and provides a sheet used for securing the attachment devices to the wall surface.

The attachment device according to the present disclosure is an attachment device for attaching an electronic device body to a wall surface, and includes: a base having a plurality of pin holes; a plurality of pins that are respectively inserted in the pin holes, and secure the base to the wall surface; and a locking part that is secured to the base, and on which the electronic device body is to be hung and locked. The base includes a securing surface that is a surface to be secured to the wall surface, and the pin holes are arranged outwardly from the base at a predetermined angle with respect to the securing surface.

The electronic device according to the present disclosure includes the above attachment device and an electronic device body.

The method of securing a plurality of attachment devices according to the present disclosure is a method of securing the attachment devices to a wall surface, each of the attachment devices including: a base having a plurality of pin holes; a plurality of pins that are respectively inserted in the pin holes, and secure the base to the wall surface; and a locking part that is secured to the base, and on which a panel-like electronic device body is to be hung and locked, and the method includes the steps of: attaching a sheet that is symmetric about a symmetry axis to the wall surface in a rotatable manner around a provisionally fixing part located on the symmetry axis; securing the base to the wall surface at a position corresponding to each of a plurality of sheet-openings provided on the sheet on an orthogonal axis that is orthogonal to the symmetry axis; and securing the locking part to the base.

The sheet according to the present disclosure is a sheet that is used for securing a plurality of attachment devices to a wall surface, and has a symmetric shape about a symmetry axis. The sheet includes: a provisionally fixing part located on the symmetry axis; and a plurality of sheet-openings located on an orthogonal axis that is orthogonal to the symmetry axis.

The attachment device and the electronic device according to the present disclosure enable a user to easily attach an electronic device body to a wall surface.

The method of securing a plurality of attachment devices and a sheet according to the present disclosure enable a user to easily secure a plurality of the attachment devices to a wall surface while the attachment devices are aligned in a horizontal direction when an electronic device body is to be attached to the wall surface by using the attachment devices.

Figure 1:
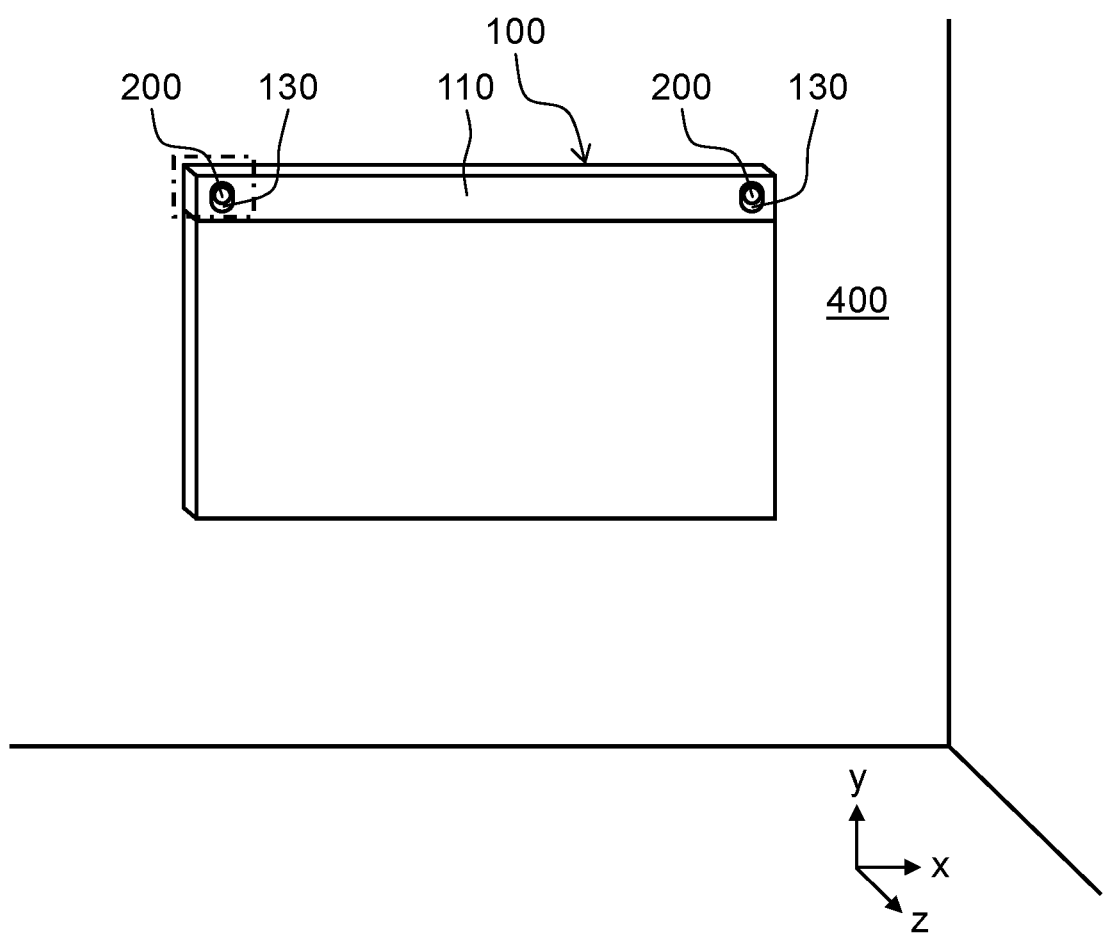
FIG. 1 is a perspective view schematically showing an example of an appearance of an electronic device secured to a wall surface according to a first exemplary embodiment.

DESCRIPTION OF EMBODIMENTS (Motivation for the Present Disclosure)

First, motivation that has led the inventors of the present application to the present disclosure is described.

When an electronic device body is to be attached to a wall surface by using with an attachment device, firstly, the attachment device needs to be secured to the wall surface with a securing member, such as a screw or a nail. However, in the case of a thin wall, such as a wall formed of a plasterboard, of which thickness is less than the length of the securing member (for example, the length of the screw or the nail), the securing member penetrates the wall and may not provide sufficient strength to support the weight of the electronic device body. Thus, when a conventional attachment device is secured to a surface of such a relatively thin wall, the attachment device needs to be secured not only to the wall but to a pillar behind the wall with a securing member, such as a screw or a nail, to obtain sufficient strength (load-bearing capacity) to support the weight of the electronic device body. However, it is hard to visually identify such a pillar behind the wall. Accordingly, a step of identifying the position of the pillar is performed in some cases by using a detection device (such as an ultrasonic sensor) that can detect a pillar behind a wall. The step, however, cannot be performed by a user who does not have (or cannot use) such a detection device, or the step is not easy for a user who is unfamiliar with handling of such a detection device. In addition, the position for securing the attachment device is limited to the position of the pillar, and thus, the arrangement position of the attachment device is less flexible than in the case where the attachment device is secured to a wall with a sufficient thickness and strength. As a result, flexibility in determining a position to secure an electronic device body is relatively low when the electronic device body is to be secured to a surface of a comparatively thin wall.

The present disclosure provides an attachment device that enables a user to easily attach an electronic device body to a wall surface, and an electronic device including the attachment device.

In the case where a plurality of attachment devices is used to secure an electronic device body to a wall surface, the attachment devices need to be secured at positions that are aligned in a horizontal direction so as to hold the electronic device body in a horizontal posture. In such a case, a step of aligning a plurality of attachment devices in the horizontal direction is conventionally performed in some cases by using an instrument designed to check inclination against a horizontal plane (for example, a level, or a spirit level). However, a user who does not have (or cannot use) such an instrument is required to perform the step with visual inspection, for example, which makes it difficult to align a plurality of attachment devices in the horizontal direction. In addition, the step is not easy for a user who is unfamiliar with handling of such an instrument.

The present disclosure provides a method of securing a plurality of attachment devices that enables a user to easily secure a plurality of the attachment devices to a wall surface while the attachment devices are aligned in a horizontal direction when an electronic device body is to be attached to the wall surface by using the attachment devices.

Hereinafter, exemplary embodiments are described in detail with reference to the drawings as appropriate. However, unnecessarily detailed descriptions may be omitted. For example, a detailed description of well-known matters, and a duplicate description of substantially identical configurations may not be provided. This is to avoid unnecessary redundancy in the following description and to facilitate understanding of those skilled in the art.

The accompanying drawings and the following exemplary embodiments are provided for those skilled in the art to fully understand the present disclosure, and merely illustrate an example of the present disclosure. Numerical values, shapes, materials, constituent elements, arrangement positions and connection modes of the constituent elements, and the like described in the following exemplary embodiments are merely examples, and therefore are not intended to limit the scope of the claims. Also, of the constituent elements in the following exemplary embodiments, constituent elements not recited in the independent claim indicating the broadest concept may be optionally added to the constituent elements described in the independent claim.

Furthermore, the drawings are not necessarily accurate illustrations, but are schematic views simplified as appropriate for ease of understanding of the present disclosure. In the drawings, the same reference numerals are assigned to substantially the same constituent elements, and duplicate description of such constituent elements may be omitted or simplified.

Each of the figures includes three axes, i.e., an x-axis, a y-axis, and a z-axis, and the x, y, and z axes are used as required to describe the following exemplary embodiments. In the exemplary embodiments, a direction parallel to a horizontal plane and also parallel to wall surface 400 is defined as an x-axis direction, a direction perpendicular to the horizontal plane (a vertical direction) is defined as a y-axis direction, and a direction parallel to the horizontal plane and perpendicular to wall surface 400 is defined as a z-axis direction, for the sake of convenience. Further, a direction away from wall surface 400 is defined as a positive z-direction, a side relatively farther from the floor is defined as a top side, a side relatively closer to the floor is defined as a bottom side, and a direction from the bottom side to the top side is defined as a positive y-direction. A direction from a left side to a right side of electronic device body 110 attached to wall surface 400 in a front view is defined as a positive x-direction. These directions, however, are not absolute directions, but are relative directions that are illustrated for the sake of convenience. The present disclosure is not limited to these directions.

(First Exemplary Embodiment)

A first exemplary embodiment is described below with reference to FIGS. 1 to 9.

[1-1. Configuration]

[1-1-1. Electronic Device]

FIG. 1 is a perspective view schematically showing an example of an appearance of electronic device 100 secured to wall surface 400 according to a first exemplary embodiment.

As shown in FIG. 1, electronic device 100 includes electronic device body 110, and attachment devices 200. In the present exemplary embodiment, electronic device 100 includes two attachment devices 200 as a configuration example, but a number of attachment device 200 included in electronic device 100 is not limited to two. The number of attachment device 200 included in electronic device 100 is set according to a number of main-body-through-hole 130 included in electronic device body 110.

According to the configuration example of the present exemplary embodiment, electronic device body 110 is a television set. Electronic device body 110 includes an image display unit formed of a liquid crystal panel or an organic electro-luminescence (EL) panel, and an upper part of electronic device body 110 includes a speaker and a substrate on which a drive circuit for driving the image display unit is mounted. The image display unit of electronic device body 110 is, for example, a 55-inch display, and electronic device body 110 weighs, for example, 10 kg. Note that electronic device body 110 is not limited to a television set, and a size of the image display unit and a weight of electronic device body 110 are not limited to the above values.

Attachment devices 200 are members secured to wall surface 400. In the present exemplary embodiment, wall surface 400 is a surface of a wall formed of a relatively thin plate, such as a plasterboard. The wall having wall surface 400 has a thickness of 9.5 mm, for example. However, the present disclosure does not limit a material and a thickness of the wall. The wall having wall surface 400 may be any material of any thickness that provide strength and durability required to support electronic device body 110. A wallpaper may be provided between attachment devices 200 and wall surface 400.

In the present exemplary embodiment, electronic device body 110 includes two main-body-through-holes 130 as a configuration example, but a number of main-body-through-hole 130 included in electronic device body 110 is not limited to two.

As exemplified in FIG. 1, the upper part of electronic device body 110 includes one of main-body-through-holes 130 at its one end in the horizontal direction (the x-axis direction) (an end in the negative x-direction), and the other one of main-body-through-holes 130 at the other end (an end in the positive x-direction). Note that positions of main-body-through-holes 130 of electronic device body 110 are not limited to those illustrated in FIG. 1. It is desirable that the positions of main-body-through-holes 130 of electronic device body 110 be set appropriately in view of stability of electronic device body 110 attached to attachment devices 200 secured to wall surface 400, strength of electronic device body 110, and the like. In other words, the above described one end and the other end are the positions of main-body-through-holes 130 of electronic device body 110 that have been determined in this manner.

Figure 2:
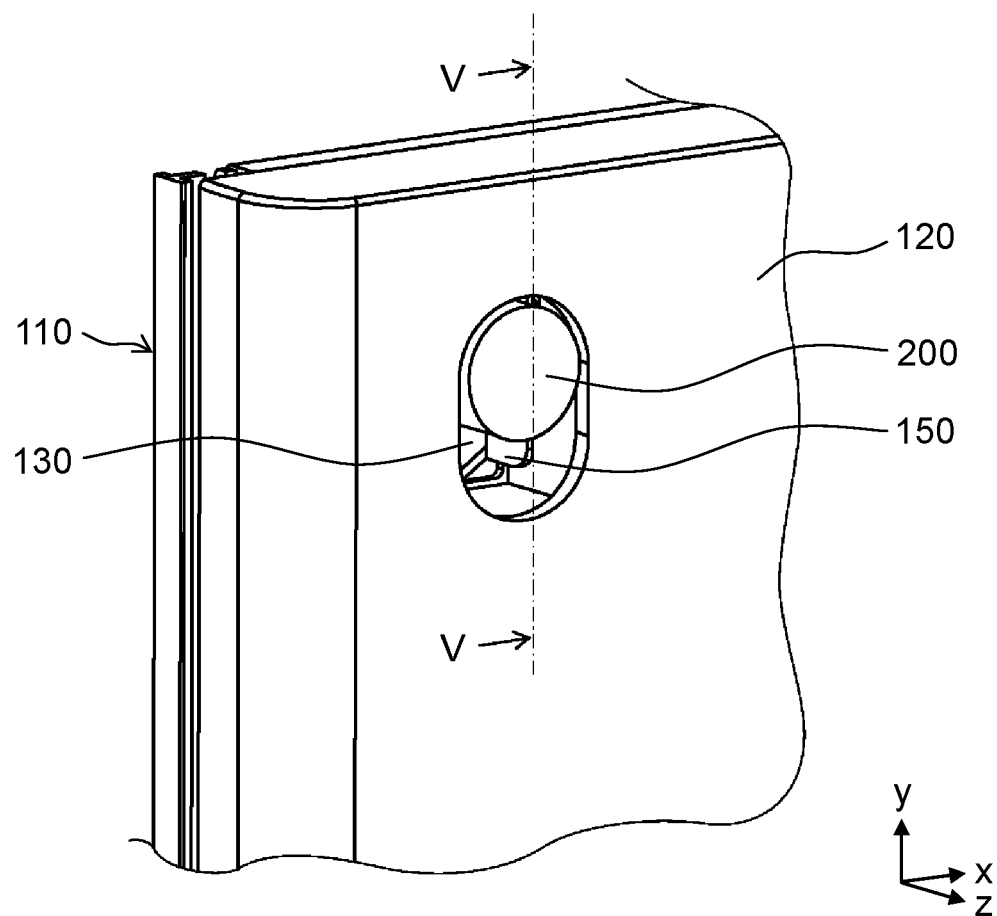
FIG. 2 is an enlarged perspective view showing part of an electronic device body secured to the wall surface according to the first exemplary embodiment.

FIG. 2 is an enlarged perspective view showing part of electronic device body 110 secured to wall surface 400 according to the first exemplary embodiment. FIG. 2 shows an enlarged view of an area surrounded by a dot-dashed line in FIG. 1 (vicinity of one of main-body-through-holes 130).

Figure 3:
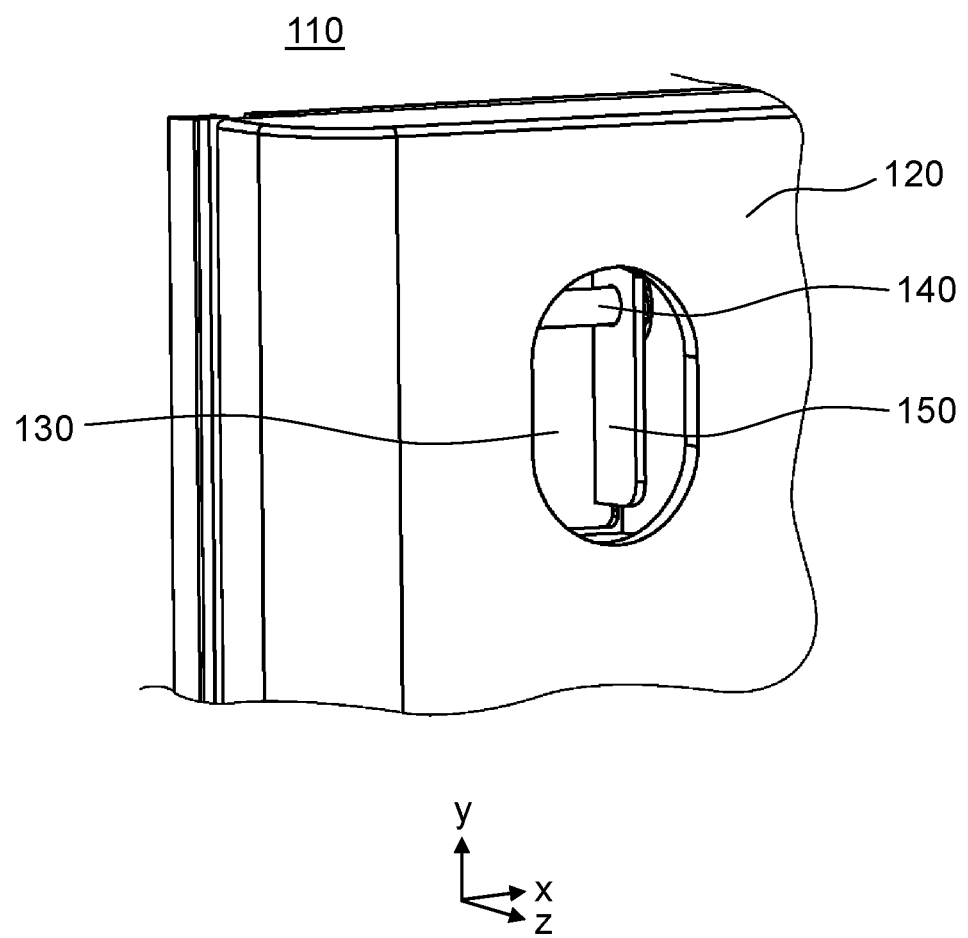
FIG. 3 is an enlarged perspective view partially showing a front side of the electronic device body according to the first exemplary embodiment.

FIG. 3 is an enlarged perspective view partially showing a front side of electronic device body 110 according to the first exemplary embodiment. FIG. 3 is an enlarged view of the vicinity of one of main-body-through-holes 130 of electronic device body 110 that is not attached to attachment devices 200.

Figure 4:
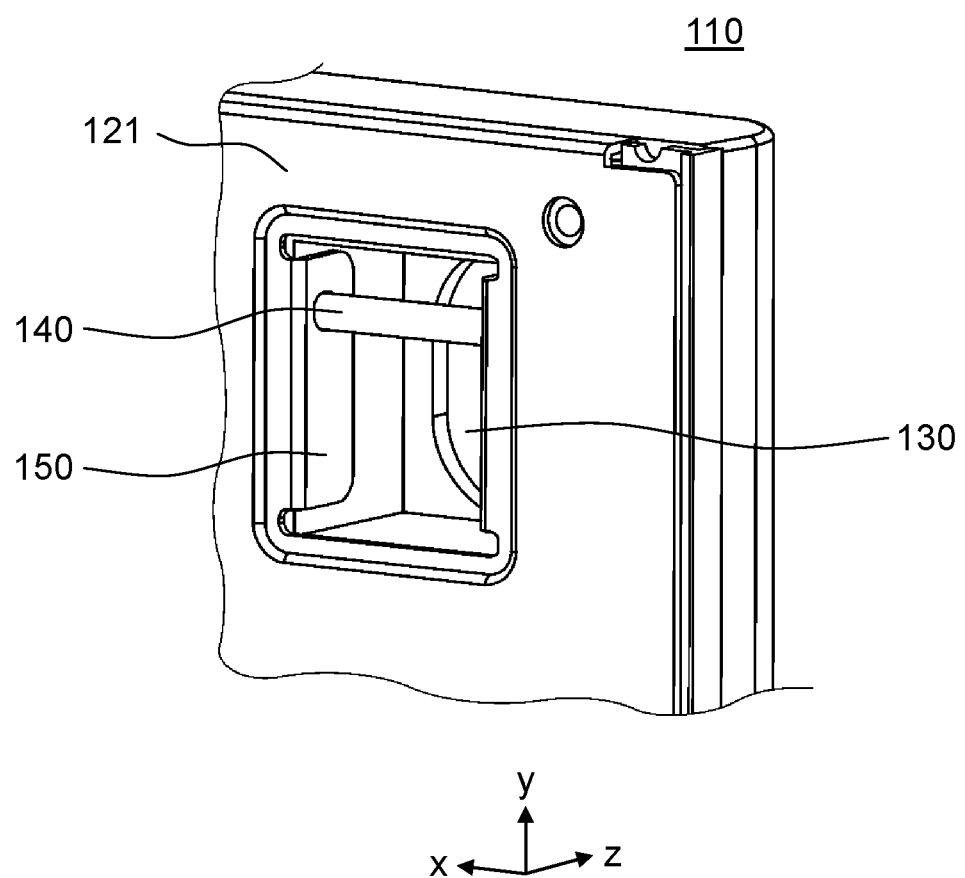
FIG. 4 is an enlarged perspective view partially showing a back side of the electronic device body according to the first exemplary embodiment.

FIG. 4 is an enlarged perspective view partially showing a back side of electronic device body 110 according to the first exemplary embodiment. FIG. 4 shows an enlarged back view of the vicinity of one of main-body-through-holes 130 shown in FIG. 3.

In the present exemplary embodiment, one of main-body-through-holes 130 has substantially the same configuration as the other one of main-body-through-holes 130. Accordingly, the following description is directed to one of main-body-through-holes 130, and the description of the other one of main-body-through-holes 130 is omitted or simplified.

As shown in FIGS. 2 to 4, electronic device body 110 has main-body-front-surface 120 that is substantially parallel to an x-y plane on a front side of electronic device body 110 (on a side in the positive z-direction), and main-body-back-surface 121 that is substantially parallel to the x-y plane on a back side of electronic device body 110 (on a side in the negative z-direction). As shown in FIGS. 2 to 4, main-body-through-hole 130 penetrates from main-body-front-surface 120 to main-body-back-surface 121 of electronic device body 110 in a direction orthogonal to main-body-front-surface 120 (in the z-axis direction).

As shown in FIGS. 3 and 4, electronic device body 110 includes one shaft 140 and two shaft holders 150 inside main-body-through-hole 130. Two shaft holders 150 are arranged to face each other at positions apart from each other in the horizontal direction (in the x-axis direction) inside main-body-through-hole 130. Two shaft holders 150 holds shaft 140 in between with sufficient strength so that shaft 140 can support the weight of electronic device body 110.

Shaft 140 has a columnar shape extended in the horizontal direction (in the x-axis direction), and is formed of a material with sufficient strength to support the weight of electronic device body 110 (for example, a metal material, etc.), and is secured by two shaft holders 150.

[1-1-2. Attachment Device]

Figure 5:
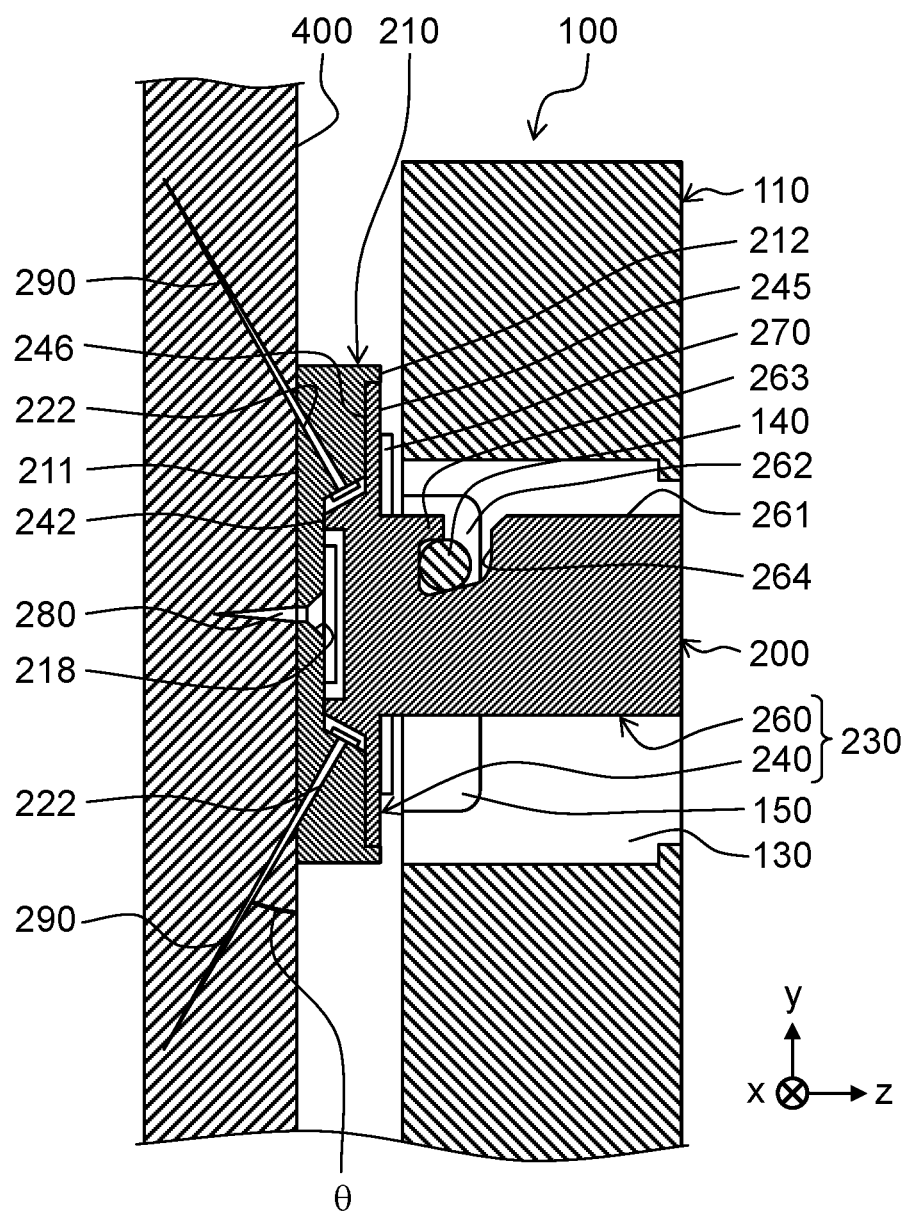
FIG. 5 is a partial sectional view schematically showing an example of a configuration of the electronic device secured to the wall surface according to the first exemplary embodiment.

FIG. 5 is a partial sectional view schematically showing an example of a configuration of electronic device 100 secured to wall surface 400 according to the first exemplary embodiment. FIG. 5 shows a sectional view taken along line V-V of FIG. 2.

The sectional view of FIG. 5 illustrates a state in which electronic device 100 is secured to wall surface 400 according to the first exemplary embodiment. As shown in FIG. 5, attachment device 200 includes base 210, locking part 230, central pin 280, a plurality of pins 290 (for example, twelve pins 290), and four screws 270. In the present exemplary embodiment, attachment device 200 includes twelve pins 290 and four screws 270 as a configuration example, but a number of pins 290 included in attachment device 200 is not limited to twelve. A number of screws 270 included in attachment device 200 is not limited to four, either.

Base 210 includes central through hole 218 configured to receive central pin 280, and a plurality of pin holes 222 (for example, twelve pin holes 222) configured to receive a plurality of pins 290 (for example, twelve pins 290) respectively. Base 210 is secured to wall surface 400 by inserting central pin 280 into wall surface 400 through central through hole 218 and also inserting a plurality of pins 290 (for example, twelve pins 290) into wall surface 400 through respective pin holes 222. Pin hole 222 is a through hole that penetrates base 210. In the present exemplary embodiment, base 210 includes twelve pin holes 222 as a configuration example, but a number of pin holes 222 included in base 210 is not limited to twelve.

Locking part 230 has a shape to fit base 210. Locking part 230 is secured to base 210 by turning four screws 270 into base 210 through respective screw-penetrating-holes 250 provided in locking part 230 (see FIG. 8). Locking part 230 is a member on which electronic device body 110 is hung and locked. Electronic device body 110 is hung and locked on locking part 230 by fitting shaft 140 of electronic device body 110 into groove 262 of locking part 230. As shown in FIG. 5, locking part 230 is partly inserted in main-body-through-hole 130 of electronic device body 110 when electronic device body 110 is secured to wall surface 400. Groove 262 will be described in detail later.

A configuration of each of attachment devices 200 is described in detail below with reference to FIGS. 6 to 8.

Figure 6:
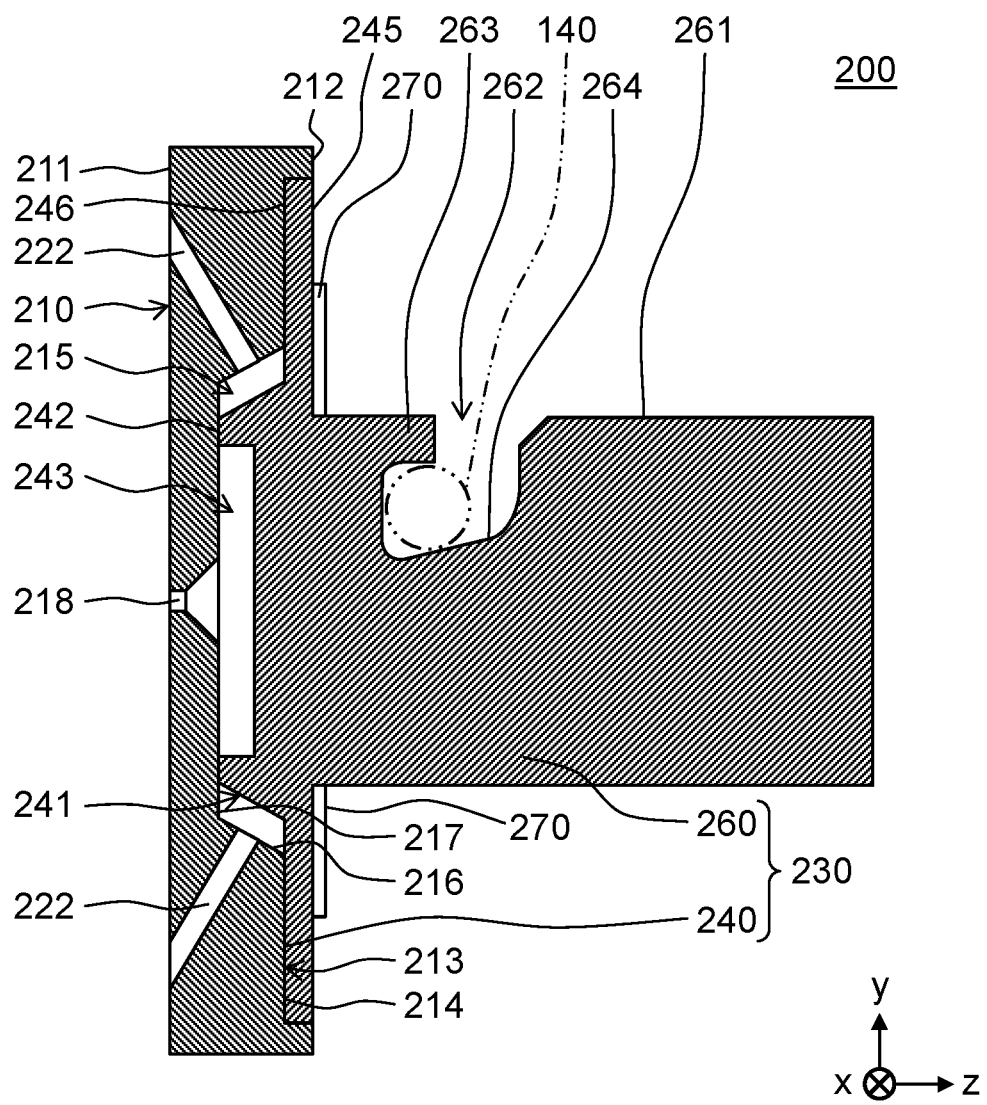
FIG. 6 is a partial sectional view showing an example of a configuration of an attachment device according to the first exemplary embodiment.

FIG. 6 is a partial sectional view showing an example of the configuration of attachment device 200 according to the first exemplary embodiment.

Figure 7:
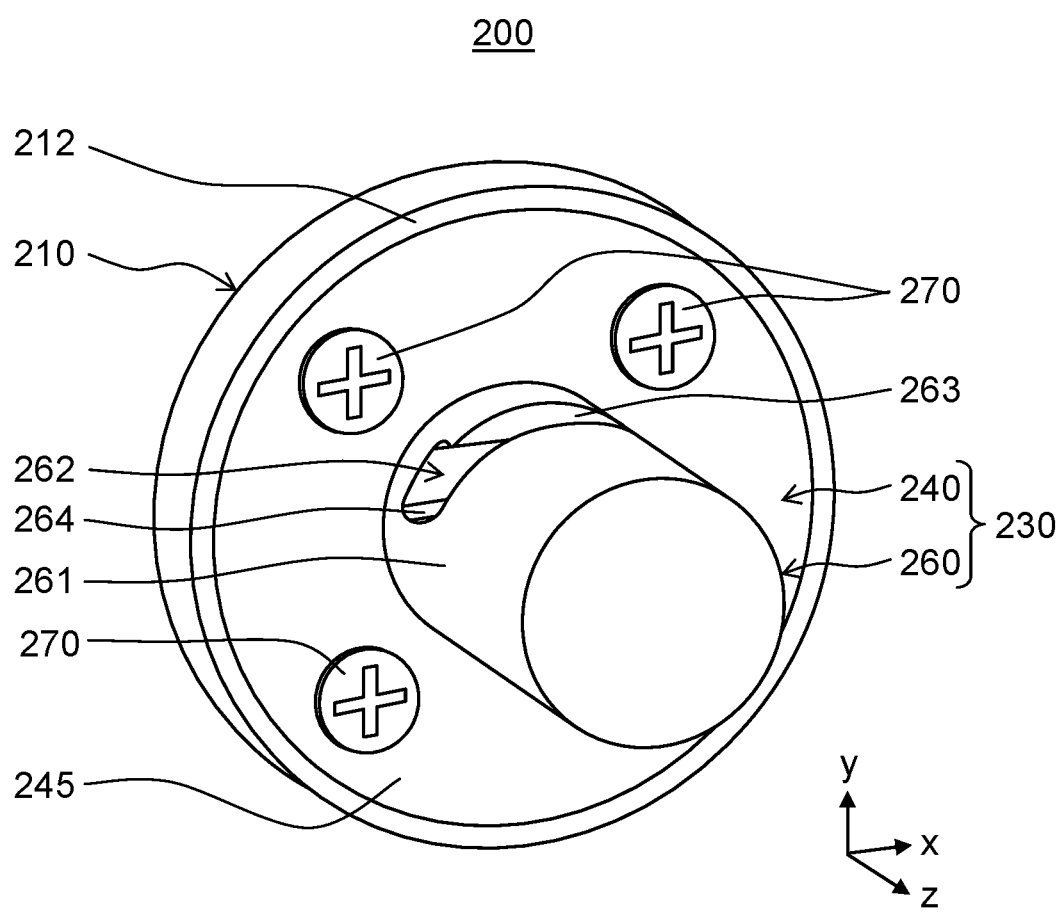
FIG. 7 is a perspective view schematically showing an example of an appearance of the attachment device according to the first exemplary embodiment.

FIG. 7 is a perspective view schematically showing an example of an appearance of attachment device 200 according to the first exemplary embodiment.

Figure 8:
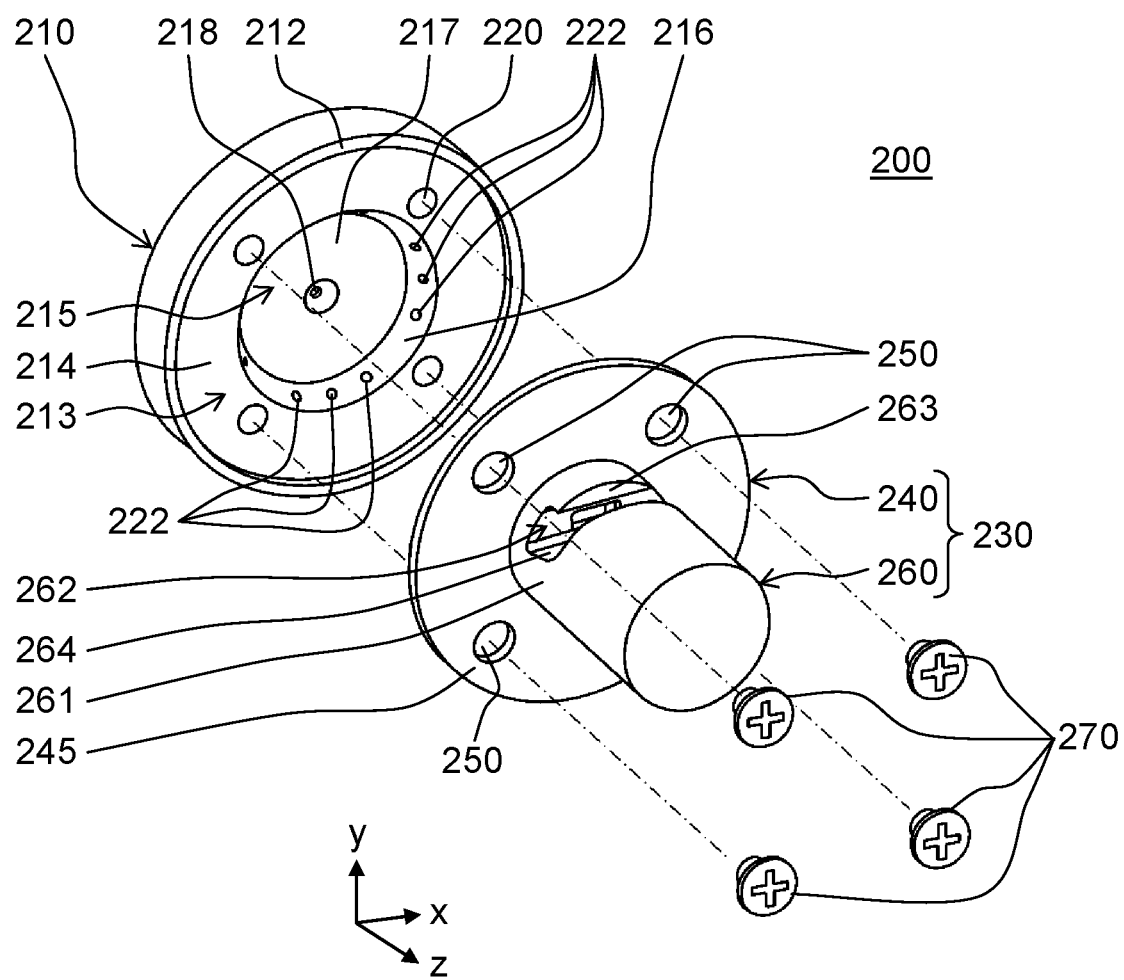
FIG. 8 is an exploded perspective view schematically showing an example of the configuration of the attachment device according to the first exemplary embodiment.

FIG. 8 is an exploded perspective view schematically showing an example of the configuration of attachment device 200 according to the first exemplary embodiment.

Note that in FIGS. 6 to 8, illustration of central pin 280 and pins 290 are omitted.

As shown in FIG. 8, base 210 has a shape of a circular column in a front view (as viewed from the z-axis direction), and is formed of a metal material, such as aluminum. The shape of base 210 in a front view is not limited to a circle, and may have any shape, such as an oval or a polygon. The material to form base 210 is not limited to aluminum, and may be any material that has sufficient strength and durability to support electronic device body 110. Base 210 has a diameter of 32 mm and a thickness of 5 mm, for example. However, base 210 is not limited to this size, and may have any size that is sufficient to support electronic device body 110.

Base 210 has securing surface 211 that is a surface secured to wall surface 400 (a surface in the negative z-direction), and front surface 212 that is a surface opposite to securing surface 211 (a surface in the positive z-direction). Base 210 includes depression 213 that has a circular shape in a front view (as viewed in the z-axis direction) and is depressed in a columnar shape in the negative z-direction at a center of front surface 212. Base 210 further includes depression 215 having a circular shape in a front view (as viewed in the z-axis direction) and depressed in the negative z-direction at a center of bottom surface 214 of depression 213. Thus, a diameter of depression 215 is smaller than a diameter of depression 213, and bottom surface 217 of depression 215 resides further in the negative z-direction than bottom surface 214 of depression 213.

Depression 215 has a shape of a circular truncated cone of which diameter gradually decreases from bottom surface 214 toward bottom surface 217 that is closer to securing surface 211 (in the negative z-direction). Thus, peripheral side surface 216 of depression 215 is not perpendicular to, but is inclined with respect to securing surface 211 (i.e., inclined with respect to the z-axis). The inclination of peripheral side surface 216 with respect to an axis perpendicular to securing surface 211 (an angle of inclination with respect to the z-axis) is 30 degrees, for example. However, the angle of inclination of peripheral side surface 216 is not limited to 30 degrees, and may be set at any angle. The angle of inclination of peripheral side surface 216 may be defined as a predetermined angle θ described below. This is because pin holes 222 are inclined at the predetermined angle θ with respect to securing surface 211 of base 210 as described below, and it is common that a head of pin 290 inserted to pin hole 222 is formed to perpendicular to a stem of pin 290.

Peripheral side surface 216 of depression 215 includes a plurality of pin holes 222 (for example, twelve pin holes 222) that penetrate from peripheral side surface 216 to securing surface 211 to receive pins 290. Bottom surface 217 of depression 215 includes at a center thereof central through hole 218 that penetrates from bottom surface 217 to securing surface 211 to receive central pin 280. Bottom surface 214 of depression 213 includes four screw holes 220 at substantially regular intervals circumferentially around central through hole 218. In the present exemplary embodiment, base 210 includes twelve pin holes 222 and four screw holes 220 as a configuration example, but a number of pin holes 222 included in base 210 is not limited to twelve. A number of screw holes 220 included in base 210 is not limited to four, either.

Locking part 230 includes fitting part 240 and protrusion 260. Locking part 230 is formed of a metal material, such as aluminum. The material to form locking part 230 is not limited to aluminum, and may be any material that has sufficient strength and durability required to support electronic device body 110.

Fitting part 240 is formed in a columnar shape and has a circular shape in a front view (as viewed from the z-axis direction). Fitting part 240 has a diameter that is substantially the same as or slightly smaller than a diameter of depression 213 of base 210, and has a shape to fit depression 213. Fitting part 240 includes protrusion 241 on a back surface 246 that is a surface to face bottom surface 214 of depression 213 (a surface in the negative z-direction). Protrusion 241 has a circular shape in a front view (as viewed from the z-axis direction) and protrudes toward base 210 (in the negative z-direction).

Protrusion 241 is formed to have a shape of a circular truncated cone of which diameter gradually decreases from back surface 246 toward bottom surface 217 of base 210 (in the negative z-direction). Protrusion 241 is formed to have a diameter that is slightly smaller than a diameter of depression 215 so as to be accommodated in depression 215 and prevent coming out of pins 290 inserted to respective pin holes 222. Protrusion 241 includes depression 243 at a center of protruding surface 242 that is a surface to face bottom surface 217 of depression 215. Depression 243 is depressed in the positive z-direction and has a circular shape in a front view (as viewed from the z-axis direction). Depression 243 has a diameter that is larger than a diameter of a head of central pin 280, and has a shape corresponding to a shape of the head of central pin 280, so that the head of central pin 280 inserted to central through hole 218 of base 210 can be accommodated in depression 243.

Fitting part 240 includes four screw-penetrating-holes 250 that are arranged to surround protrusion 260 and penetrate fitting part 240 from front surface 245 to back surface 246. Screw-penetrating-holes 250 are arranged at positions corresponding to screw holes 220 so that screws 270 can be turned into screw holes 220 of base 210 through screwpenetrating-holes 250, respectively. A number of screw-penetrating-holes 250 included in fitting part 240 is not limited to four. The number of screw-penetrating-holes 250 included in fitting part 240 may be any number that corresponds to the number of screw holes 220 included in base 210.

According to the above configuration, fitting part 240 can be fitted in base 210 while central pin 280 is inserted in central through hole 218 of base 210, and a plurality of pins 290 (for example, twelve pins 290) are respectively inserted in a plurality of pin holes 222 (for example, twelve pin holes 222) of base 210. As shown in FIG. 8, a plurality of screws 270 (for example, four screws 270) are respectively turned into screw holes 220 through screw-penetrating-holes 250, so that locking part 230 can be secured to base 210.

Protrusion 260 is formed in a columnar shape protruded from front surface 245 in the positive z-direction, and has a circular shape in a front view (as viewed from the z-axis direction). Front surface 245 is a surface of fitting part 240, and is an opposite surface of back surface 246 (a surface in the positive z-direction).

Protrusion 260 includes groove 262 configured to receive shaft 140 of electronic device body 110 at the time of attaching electronic device body 110 to attachment device 200 secured to wall surface 400. Groove 262 is provided on peripheral side surface 261 of protrusion 260 in parallel with front surface 245. Groove 262 is configured to extend in the horizontal direction (in the x-axis direction) and be depressed downward (in the negative y-direction) when locking part 230 is secured to base 210. In other words, locking part 230 is secured to base 210 in a state in which groove 262 extends in the horizontal direction (in the x-axis direction) and is depressed downward (in the negative y-direction).

Groove 262 includes projection 263 projecting in the positive z-direction at an upper part of groove 262 closer to front surface 245 (in the negative z-direction). Projection 263 is configured to locate above shaft 140 (in the positive y-direction) when shaft 140 of electronic device body 110 is fitted in groove 262. An opening of groove 262 is narrowed by projection 263, but has a width larger than a diameter of shaft 140 so that shaft 140 can be smoothly fit into groove 262.

Inside surface 264 of groove 262 includes a region that is a lowest part (farthest in the negative y-direction) of inside surface 264 at a position below projection 263 (in the negative y-direction) in a sectional side view of groove 262 (in a sectional shape as viewed in the x-axis direction). Inside surface 264 of groove 262 slopes toward the lowest part. With this configuration, shaft 140 fitted into groove 262 is guided to the lowest part by the weight of electronic device body 110, and is secured to the position below projection 263 (in the negative y-direction). As shown in FIG. 6, inside surface 264 of groove 262 may include an arc-shaped portion in a sectional side view of groove 262 (in a sectional shape as viewed in the x-axis direction) so that shaft 140 smoothly slides on inside surface 264.

Figure 9:
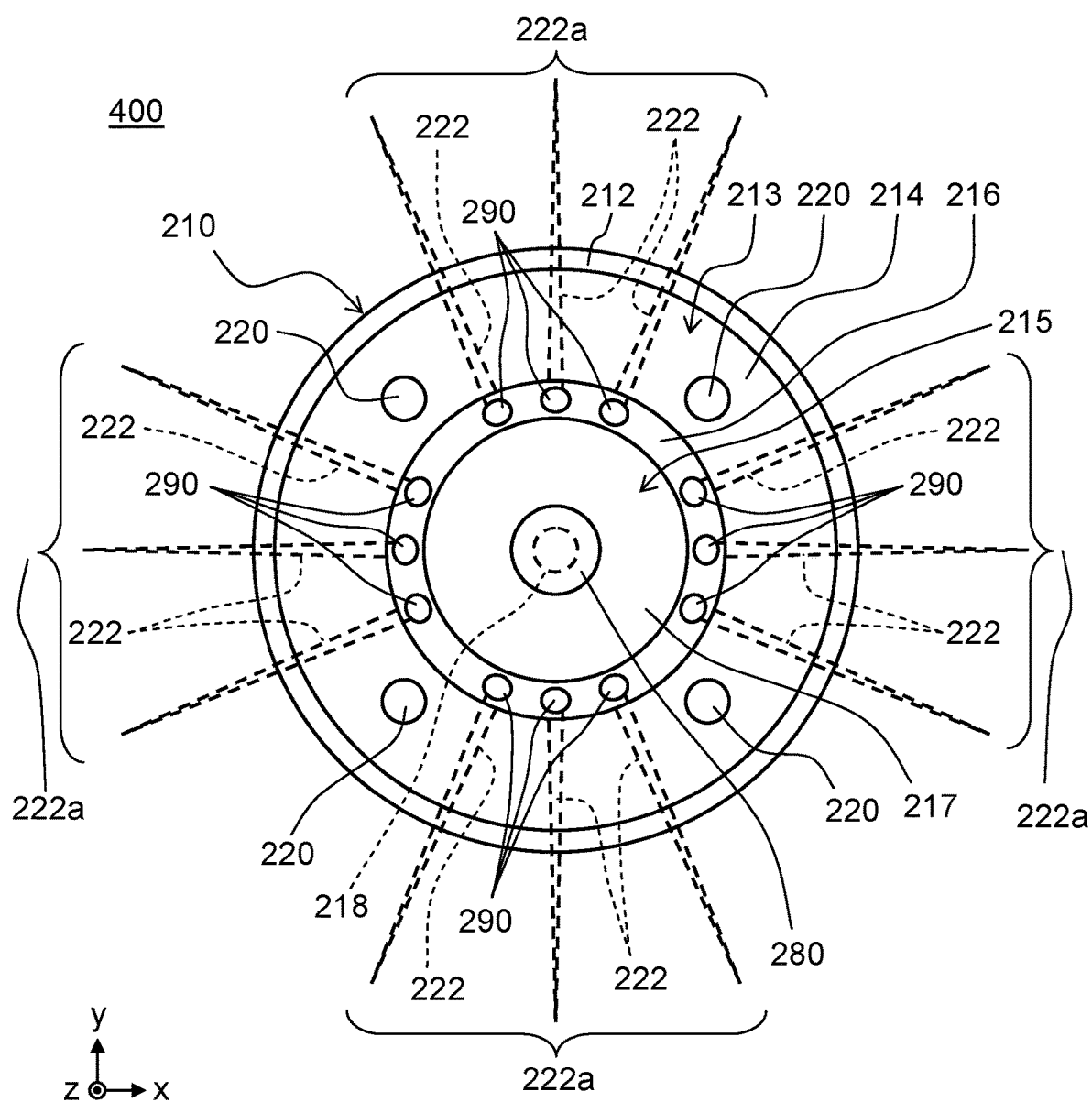
FIG. 9 is a front view schematically showing an example of a base according to the first exemplary embodiment.

FIG. 9 is a front view schematically showing an example of base 210 according to the first exemplary embodiment. FIG. 9 shows a state in which base 210 is secured to wall surface 400.

As shown in FIG. 9, base 210 is secured to wall surface 400 with central pin 280 and a plurality of pins 290 (for example, twelve pins 290). Central pin 280 and pins 290 are formed of a metal material such as stainless steel. However, the material to form central pin 280 and pins 290 is not limited to stainless steel, and may be any material that has sufficient strength and durability required to support electronic device body 110. Each of central pin 280 and pins 290 may be a nail, or may be a screw. Each of pins 290 has a length of 18 mm, for example, but is not limited thereto. Each of pins 290 may be set to have any length that can sufficiently support electronic device body 110 in view of the length of pin holes 222.

As shown in FIG. 9, pin holes 222 of base 210, through which pins 290 (for example, twelve pins 290) are respectively inserted, extend radially in directions from central through hole 218 at a center of base 210 (see FIG. 8) toward an outer periphery of base 210. Each of pin holes 222 is inclined at the predetermined angle θ with respect to securing surface 211 of base 210 (see FIG. 5). Thus, pins 290 respectively inserted through pin holes 222 are arranged radially in the directions from central through hole 218 of base 210 toward the outer periphery of base 210 as shown in FIG. 9, and are inclined at the predetermined angle θ with respect to wall surface 400 (see FIG. 5). In the present exemplary embodiment, the predetermined angle θ refers to an angle at which pin holes 222 extend with respect to wall surface 400 in a state in which base 210 is secured to wall surface 400. The predetermined angle θ exemplified in the present exemplary embodiment as a specific example is 30 degrees, but the predetermined angle θ is not limited to 30 degrees and may be any angle. In the present exemplary embodiment, the predetermined angle θ is desirably set equal to or greater than 20 degrees and less than or equal to 40 degrees.

As shown in FIG. 9, twelve pin holes 222 included in base 210 are divided into pin hole groups 222a each of which includes three pin holes 222 according to an example illustrated in the present exemplary embodiment. Accordingly, base 210 includes four pin hole groups 222a in an example shown in FIG. 9. A number of pin holes 222 included in base 210 is not limited to twelve, and a number of pin holes 222 included in each pin hole group 222a is not limited to three, either.

In base 210, pin hole groups 222a are arranged at substantially regular intervals on peripheral side surface 216 of base 210. In each of pin hole groups 222a, pin holes 222 are arranged at substantially regular intervals (for example, approximately every 22.5 degrees around central through hole 218). Pin holes 222 are arranged not to overlap screw holes 220. In other words, pin hole groups 222a are arranged in such a manner that each of screw holes 220 is located between one of pin hole groups 222a and another one of pin hole groups 222a. Thus, base 210 includes twelve pin holes 222 and four screw holes 220 that are arranged at every 22.5 degrees around central through hole 218 according to an example shown in FIG. 9.

[1-2. Operation of Attaching Electronic Device Body]

An operation of attaching electronic device body 110 to attachment device 200 configured as above is described below with reference to FIGS. 5 and 6.

First, positions to secure attachment devices 200 to wall surface 400 are determined in view of where to attach electronic device body 110 on wall surface 400. Note that, in the present exemplary embodiment, electronic device body 110 includes two main-body-through-holes 130, and thus, two positions on wall surface 400 corresponding to two main-body-through-holes 130 are determined to be the positions for securing two attachment devices 200.

Then, securing surface 211 of base 210 is abutted onto wall surface 400 at each of the determined positions. In this state, central pin 280 is inserted through central through hole 218 of each of bases 210, and then inserted into wall surface 400. Central pin 280 may be a screw, and in such a case, central pin 280 is screwed into wall surface 400. In this manner, bases 210 are provisionally secured to wall surface 400. It is desirable to confirm whether two bases 210 are level with each other (substantially in parallel with the x-axis direction) by using a level (or a spirit level) or the like while two bases 210 are provisionally secured to wall surface 400. In the case where two bases 210 are not level with each other (in parallel with the x-axis direction), the positions of two bases 210 are adjusted to be level with each other (in parallel with the x-axis direction). In the present exemplary embodiment, each of attachment devices 200 is just provisionally secured to wall surface 400 with central pin 280 at this moment and can be easily detached from wall surface 400, which makes it easy to adjust the position of each of attachment devices 200.

Then, a plurality of pins 290 (for example, twelve pins 290) are inserted through respective pin holes 222, and then into wall surface 400. Pins 290 may be screws, and in such a case, pins 290 are screwed into wall surface 400. In this manner, base 210 is secured to wall surface 400.

In the present exemplary embodiment, pins 290 are inclined at the predetermined angle θ (for example, 30 degrees) with respect to wall surface 400 as described above. Accordingly, even when a length of each of pins 290 (for example, 18 mm) is greater than a thickness of the wall (for example, 9.5 mm) having wall surface 400, pins 290 do not penetrate the wall. Specifically, pins 290 do not penetrate the wall having wall surface 400 as long as the following inequality is satisfied.

(the length of pins 290−the length of pin holes 222)×sin θ≤the thickness of the wall Thus, pins 290 are inserted into the wall without penetrating the wall even when the thickness of the wall having wall surface 400 is relatively thin. This enhances the binding strength between the wall and pins 290, which makes pins 290 less likely to come out from the wall. This configuration enables base 210 secured to wall surface 400 to enhance the strength (load-bearing capacity) for supporting electronic device body 110.

After two bases 210 have been secured to wall surface 400, fitting part 240 of locking part 230 is fitted to each of bases 210 that has been secured to wall surface 400. Then, a plurality of screws 270 (for example, four screws 270) are turned into screw holes 220 of each of bases 210 through screw-penetrating-holes 250 of locking part 230, respectively. In this manner, locking part 230 is secured to each of bases 210.

By fitting locking part 230 to base 210, protrusion 241 of locking part 230 are accommodated in depression 215 of each of bases 210, which suppresses coming out of pins 290 that have been inserted in pin holes 222. This configuration makes pins 290 inserted in wall surface 400 much less likely to come out from the wall.

After locking part 230 has been secured to each of two bases 210, electronic device body 110 is brought near to wall surface 400 such that locking part 230 secured to each of bases 210 is partly inserted in corresponding one of main-body-through-holes 130 of electronic device body 110. Then, each of two shafts 140 of electronic device body 110 is fitted into groove 262 of locking part 230. In this manner, electronic device body 110 is attached to two attachment devices 200 that have been secured to wall surface 400.

Note that caps (not shown) to close main-body-through-holes 130 of electronic device body 110 may be attached to main-body-through-holes 130.

[1-3. Effects and Others]

As described above, the attachment device according to the present exemplary embodiment is an attachment device for attaching an electronic device body to a wall surface, and includes: a base having a plurality of pin holes; a plurality of pins that are respectively inserted in the pin holes, and secure the base to the wall surface; and a locking part that is secured to the base, and on which the electronic device body is to be hung and locked. The base includes a securing surface that is a surface to be secured to the wall surface, and the pin holes are respectively arranged outwardly from the base at a predetermined angle with respect to the securing surface.

The electronic device according to the present exemplary embodiment includes the attachment device and an electronic device body.

Note that attachment devices 200 are an example of the attachment device. Wall surface 400 is an example of the wall surface. Electronic device body 110 is an example of the electronic device body. Pin holes 222 are an example of the pin holes. Base 210 is an example of the base. Pins 290 are an example of the pins. Locking part 230 is an example of the locking part. Securing surface 211 is an example of the securing surface. Electronic device 100 is an example of the electronic device.

For example, attachment devices 200 illustrated in the first exemplary embodiment are used when electronic device body 110 is attached to wall surface 400, and each of attachment devices 200 includes base 210 and a plurality of pins 290 (for example, twelve pins 290), and locking part 230. Base 210 includes a plurality of pin holes 222 (for example, twelve pin holes 222). Pins 290 are respectively inserted in pin holes 222 to secure base 210 to wall surface 400. Locking part 230 is secured to base 210 and on which electronic device body 110 is to be hung and locked. Base 210 includes securing surface 211 that is a surface to be secured to wall surface 400. Pin holes 222 are respectively arranged at the predetermined angle θ with respect to securing surface 211 in directions outwardly from base 210.

Electronic device 100 illustrated in the first exemplary embodiment includes attachment devices 200 and electronic device body 110.

In each of attachment devices 200 configured like this, pin holes 222 are arranged at the predetermined angle θ with respect to securing surface 211 in directions outwardly from base 210. Accordingly, pins 290 can secure base 210 at positions distant from each other inside the wall (such as a plasterboard) having wall surface 400. In other words, attachment devices 200 can distribute a load caused by electronic device body 110 over a wide area within the wall (for example, a plasterboard). In addition, pins 290 having a length greater than the thickness of the wall (for example, a plasterboard) can be used, since pin holes 222 are arranged outwardly from base 210. As a result, even in the case of a relatively thin wall (for example, a plasterboard), an area of a friction surface (a contact area) between pins 290 and the plasterboard can be made relatively large. This enhances the binding strength between pins 290 and the wall (for example, a plasterboard).

Consequently, attachment devices 200 can obtain sufficient strength (load-bearing capacity) to support electronic device body 110 without the need of securing pins 290 to a pillar behind the wall (for example, a plasterboard). This enables a user to attach electronic device body 110 to wall surface 400 by simply securing attachment devices 200 to the wall (for example, a plasterboard).

In addition, flexibility in determining a position to secure attachment device 200 is enhanced, as pins 290 need not be secured to a pillar behind the wall (for example, a plasterboard). In other words, flexibility in determining a position to secure electronic device body 110 on wall surface 400 is enhanced.

In the attachment device, the pin holes may be respectively arranged in directions that extend radially from a center of the base.

For example, in attachment device 200 illustrated in the first exemplary embodiment, pin holes 222 are respectively arranged radially from the center of base 210.

In attachment device 200 configured as above, pins 290 can secure base 210 at positions more distant from each other inside the wall (for example, a plasterboard). This configuration further enhances the strength (load-bearing capacity) of attachment device 200.

In the attachment device, the predetermined angle may be equal to or greater than 20 degrees and less than or equal to 40 degrees.

For example, in attachment device 200 illustrated in the first exemplary embodiment, the predetermined angle θ is equal to or greater than 20 degrees and less than or equal to 40 degrees.

Attachment devices 200 configured as above can easily obtain the strength (load-bearing capacity) against loads to wall surface 400 both in a pulling direction and in a direction parallel to wall surface 400.

In the attachment device, the locking part may include a groove configured to receive a shaft that is included in the electronic device body and extends in a horizontal direction in a state in which the electronic device body is attached to the wall surface.

Shaft 140 is an example of the shaft.

For example, in the configuration example illustrated in the first exemplary embodiment, electronic device body 110 includes shaft 140 that extends in a horizontal direction in a state in which electronic device body 110 is attached to wall surface 400. Locking part 230 of each of attachment devices 200 includes groove 262 configured to receive shaft 140.

Attachment devices 200 configured as above can receive electronic device body 110 equipped with shaft 140 in a stable state.

In the attachment device, the groove may include a projection positioned above the shaft in a state in which the electronic device body equipped with the shaft is attached to the attachment device.

Projection 263 is an example of the projection.

For example, in attachment device 200 illustrated in the first exemplary embodiment, groove 262 includes projection 263 positioned above shaft 140 in a state in which electronic device body 110 equipped with shaft 140 is attached to attachment devices 200.

In each of attachment devices 200 configured as above, projection 263 restricts shaft 140 from moving upward, even when an external force in a direction to lift electronic device body 110 (in the positive y-direction) is accidentally (or unexpectedly) applied to electronic device body 110 attached to attachment devices 200. This can prevent shaft 140 from accidentally (or unexpectedly) coming out from groove 262, which reduces a possibility that electronic device body 110 falls from groove 262 and is damaged.

In the attachment device, an inside surface of the groove may include an arc-shaped portion in a sectional view.

Inside surface 264 is an example of the inside surface.

For example, in attachment device 200 illustrated in the first exemplary embodiment, inside surface 264 of groove 262 includes an arc-shaped portion in a sectional side view of groove 262 (in a sectional shape as viewed in the x-axis direction).

For example, electronic device body 110 pivotally moves around a side on its upper end and closer to a wall surface 400, when a lower end of electronic device body 110 is pulled in a direction away from wall surface 400 (in the positive z-direction). At this moment, shaft 140 easily moves along inside surface 264, since inside surface 264 of groove 262 includes the arc-shaped portion in each of attachment devices 200 configured as above. This suppresses concentration of stress to shaft 140 and groove 262, which reduces a possibility that electronic device 100 is damaged. Each of attachment devices 200 illustrated in the first exemplary embodiment includes a region that is a lowest part (farthest in the negative y-direction) of inside surface 264 at a position below projection 263 provided on inside surface 264 of groove 262 in a sectional side view of groove 262 (in a sectional shape as viewed in the x-axis direction). Inside surface 264 of groove 262 slopes toward the lowest part. Accordingly, groove 262 can guide shaft 140 to an area below projection 263 by the weight of electronic device body 110 when shaft 140 is fitted in groove 262.

In the electronic device, the electronic device body may include a main-body-through-hole that is a through hole in which at least part of the locking part is inserted.

Main-body-through-holes 130 are an example of the main-body-through-hole.

For example, in electronic device 100 illustrated in the first exemplary embodiment, electronic device body 110 includes main-body-through-holes 130, and at least part of locking part 230 is inserted in each of main-body-through-holes 130.

A user of electronic device 100 configured as above can identify the positions of attachment devices 200 through main-body-through-holes 130 of electronic device body 110 when attaching electronic device body 110 to attachment device 200. Accordingly, a user can easily attach electronic device body 110 to attachment devices 200 secured to wall surface 400.

(Second Exemplary Embodiment)

A second exemplary embodiment is described below with reference to FIGS. 10 to 15. In the second exemplary embodiment, a method for securing a plurality of attachment devices included in an electronic device to a wall surface by using a sheet is described. Note that a configuration of the electronic device including the attachment devices according to the second exemplary embodiment is substantially the same as electronic device 100 including attachment devices 200 described in the first exemplary embodiment, and thus the electronic device described in the second exemplary embodiment is also referred to as electronic device 100 and detailed description thereof will be omitted. In the following exemplary embodiments including the second exemplary embodiment, components substantially the same as the components described in the first exemplary embodiment are given reference marks identical to reference marks of the components described in the first exemplary embodiment, and descriptions thereof are omitted.

[2-1. Sheet]

Figure 10:
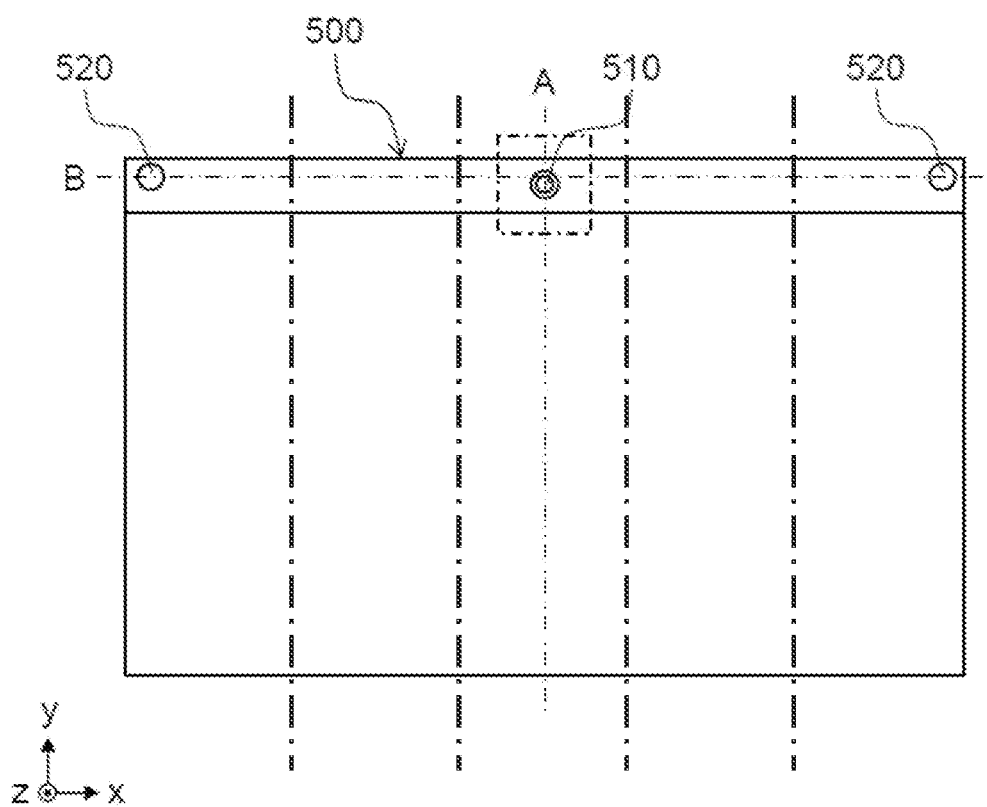
FIG. 10 is a front view schematically showing an example of a sheet according to a second exemplary embodiment.

FIG. 10 is a front view schematically showing an example of sheet 500 according to the second exemplary embodiment.

In the second exemplary embodiment, two attachment devices 200 included in electronic device 100 are aligned and secured by a securing method using sheet 500 to positions on wall surface 400 that are arranged at the same height in the vertical direction (in the y-axis direction) and aligned in the horizontal direction (in the x-axis direction) with an appropriate space in between. In other words, in the second exemplary embodiment, use of sheet 500 enables two attachment devices 200 included in electronic device 100 to be secured to the positions on wall surface 400 that are aligned in the horizontal direction (in the x-axis direction) (i.e., in a line in the horizontal direction). A distance between two attachment devices 200 in the horizontal direction (in the x-axis direction) is set according to positions of two main-body-through-holes 130 included in electronic device body 110. Electronic device body 110 is secured to wall surface 400 in a horizontal state by being attached to two attachment devices 200 that are aligned to be level with each other and secured to wall surface 400.

As shown in FIG. 10, sheet 500 includes provisionally fixing part 510 and a plurality of sheet-openings 520. In the present exemplary embodiment, sheet 500 includes two sheet-openings 520, but a number of sheet-openings 520 included in sheet 500 is not limited to two. The number and positions of sheet-openings 520 included in sheet 500 are set according to a number and positions of main-body-through-holes 130 included in electronic device body 110.

Sheet 500 is formed of a material that is relatively light and easy to be processed, such as thick paper. The material for forming sheet 500 is not limited to thick paper, and may be any material. Sheet 500 is desirably formed of a material that is relatively light and easy to be processed and has strength not to tear or bend under a use condition of sheet 500 described later (in a state in which sheet 500 is locked to a pin with provisionally fixing part 510).

Sheet 500 has a symmetric shape with respect to symmetry axis A shown in FIG. 10. Specifically, sheet 500 has a rectangular shape that is symmetric with respect to symmetry axis A in a front view (as viewed from the z-axis direction). The shape of sheet 500 in a front view (as viewed from the z-axis direction) is substantially the same as a shape of electronic device body 110 in a front view (as viewed from the z-axis direction). Sheet 500 may include on its front surface (a surface in the positive z-direction) a picture or a photograph of an appearance of electronic device body 110 in a front view (as viewed from the z-axis direction) in order to visually show a user where to attach electronic device body 110 on wall surface 400. The shape of sheet 500 is not limited to a rectangular shape, and may be any shape that allows the gravity to act substantially equally on both sides of symmetry axis A. For example, sheet 500 may have a shape having a curve.

Provisionally fixing part 510 is an opening provided on sheet 500, and penetrates sheet 500. Provisionally fixing part 510 is located at one end of sheet 500 on symmetry axis A. Here, the one end of sheet 500 on symmetry axis A is a point on symmetry axis A in a region close to an end of sheet 500 among three regions, where sheet 500 is divided into three regions along a direction orthogonal to symmetry axis A (i.e., sheet 500 is divided into three regions so that short sides of sheet 500 are divided into three). An opening of provisionally fixing part 510 has a circular shape.

Provisionally fixing part 510 is described in detail below with reference to FIGS. 11 and 12.

Figure 11:
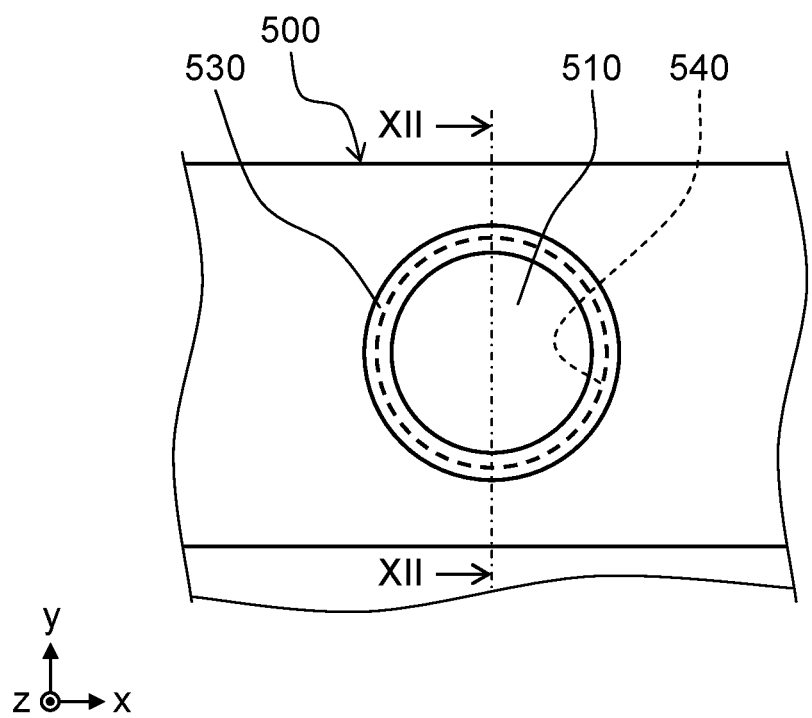
FIG. 11 is an enlarged front view of part of the sheet according to the second exemplary embodiment.

FIG. 11 is an enlarged front view of part of sheet 500 according to the second exemplary embodiment. FIG. 11 shows an enlarged view of a portion surrounded by a dot-dashed line in FIG. 10.

Figure 12:
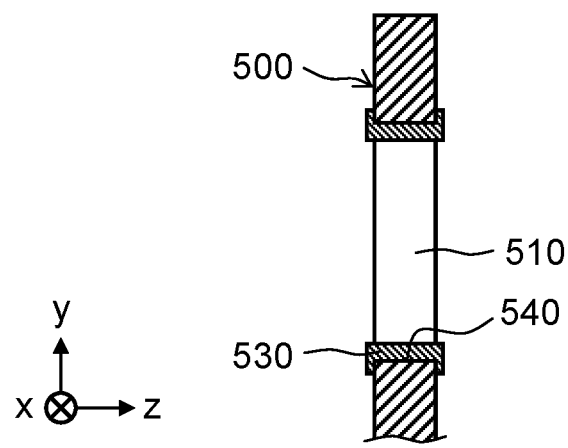
FIG. 12 is a partial sectional view schematically showing an example of a configuration of a provisionally fixing part of the sheet according to the second exemplary embodiment.

FIG. 12 is a partial sectional view schematically showing an example of a configuration of provisionally fixing part 510 of sheet 500 according to the second exemplary embodiment. FIG. 12 shows a sectional view taken along line XII-XII of FIG. 11.

As shown in FIGS. 11 and 12, sheet 500 includes protective metal part 530 to cover and protect circumferential edge 540 of provisionally fixing part 510. As shown in FIG. 12, protective metal part 530 partly extends from fixing part 510 onto both surfaces (a surface in the positive z-direction and a surface in the negative z-direction) of sheet 500, and the extended portions of protective metal part 530 are folded to contact the respective surfaces of sheet 500. With this configuration, protective metal part 530 covers circumferential edge 540 of provisionally fixing part 510 and a periphery of circumferential edge 540.

As shown in FIG. 10, sheet-openings 520 are openings located on orthogonal axis B that is orthogonal to symmetry axis A, and penetrate sheet 500. One of sheet-openings 520 is located at one end of sheet 500 in the horizontal direction (in the x-axis direction), and the other one of sheet-openings 520 is located at the other end of sheet 500 in the horizontal direction (in the x-axis direction). Here, the one end of sheet 500 in the horizontal direction is a region close to one end of sheet 500 among five regions, where sheet 500 is divided into five regions along a direction orthogonal to orthogonal axis B (i.e., sheet 500 is divided into five regions so that long sides of sheet 500 are divided into five). The other end of sheet 500 in the horizontal direction is a region close to the other end of sheet 500 divided into five regions (an end opposite to the one end of sheet 500 in the horizontal direction with respect to symmetry axis A). Each of sheet-openings 520 is formed to have a circular shape. However, a shape of each of sheet-openings 520 is not limited to a circular shape. For example, each of sheet-openings 520 may have a shape corresponding to the shape of base 210 in a front view, in the case where base 210 in a front view (as viewed from the z-axis direction) has a shape other than a circular shape (for example, a shape of a triangle, a quadrilateral, a polygon, an ellipse, etc.).

Figure 13:
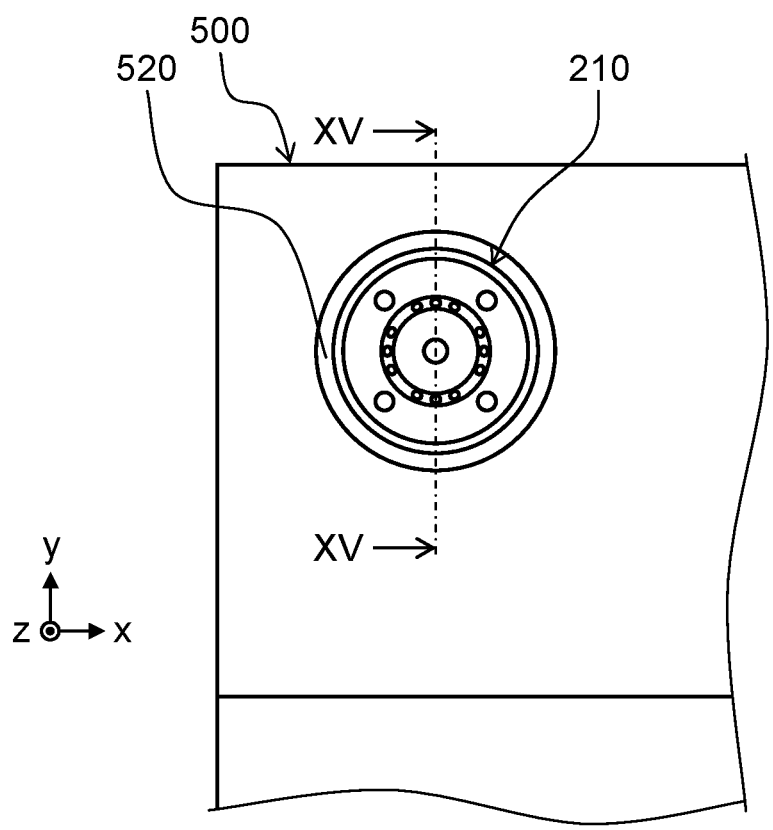
FIG. 13 is a front view schematically showing an example of a state in which the sheet and the base are secured to the wall surface according to the second exemplary embodiment.

FIG. 13 is a front view schematically showing an example of a state in which sheet 500 and base 210 are secured to wall surface 400 according to the second exemplary embodiment.

In the present exemplary embodiment, one of sheet-openings 520 has substantially the same configuration as the other one of sheet-openings 520. Accordingly, the following description is directed to one of sheet-openings 520, and the description of the other one of sheet-openings 520 is omitted or simplified.

As shown in FIG. 13, sheet-opening 520 has a diameter larger than a diameter of base 210, and is formed to have a shape that can surround base 210 in a front view (as viewed from the z-axis direction).

[2-2. Securing Method of Electronic Device]

A method of securing electronic device 100 to wall surface 400 in a horizontal state by aligning and securing two bases 210 to wall surface 400 in the horizontal direction (the x-axis direction) by using sheet 500 is described below with reference to FIGS. 10, 13, 14, and 15.

Figure 14:
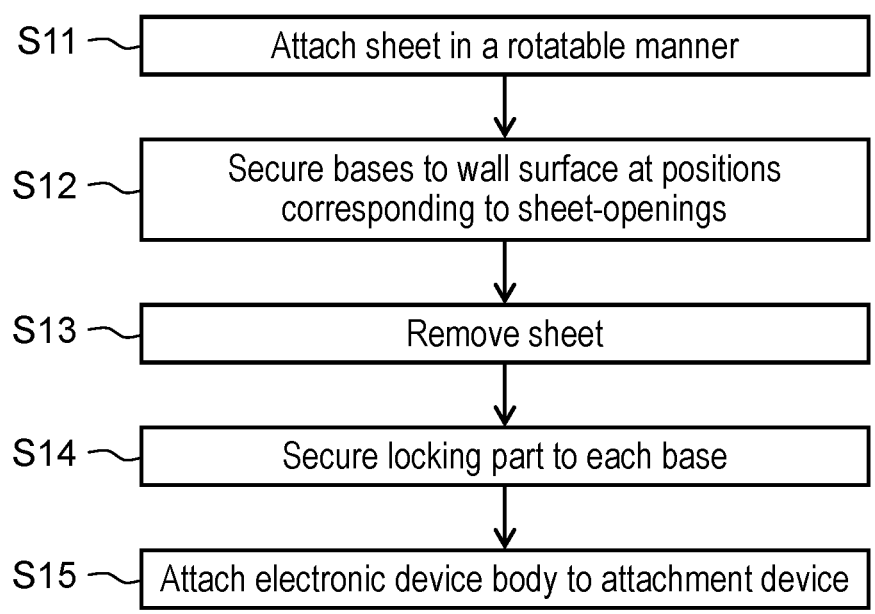
FIG. 14 is a flowchart illustrating an example of a method of securing the electronic device according to the second exemplary embodiment.

FIG. 14 is a flowchart illustrating an example of a method of securing electronic device 100 according to the second exemplary embodiment.

Figure 15:
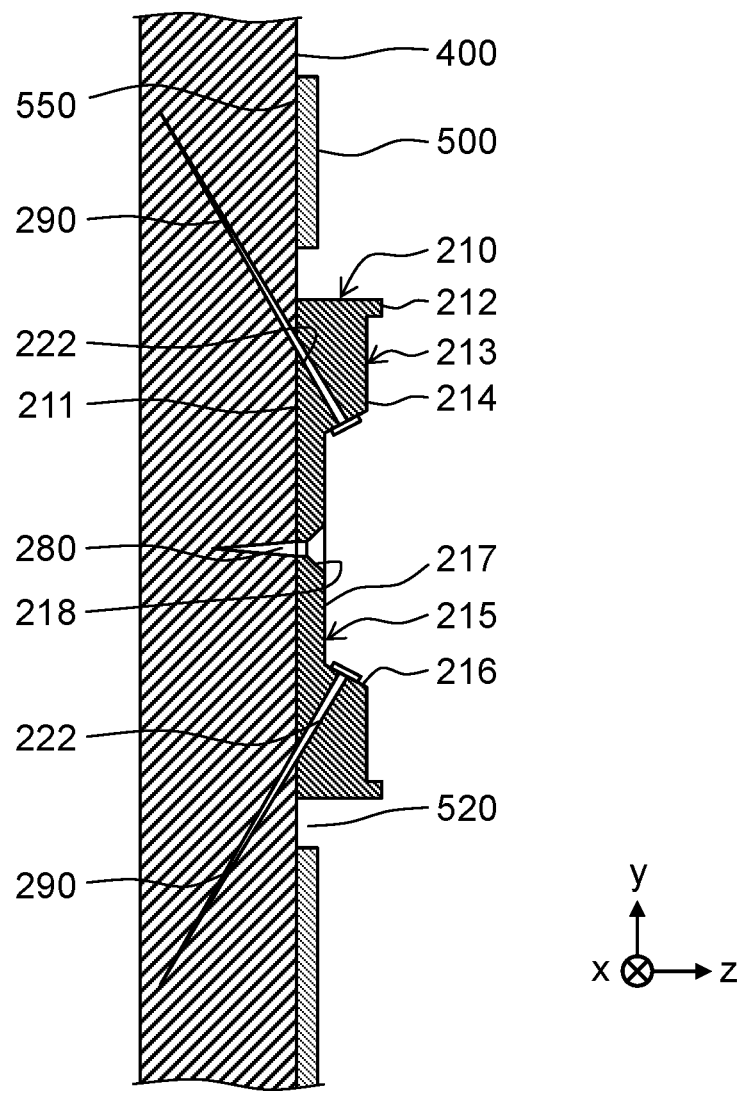
FIG. 15 is a partial sectional view schematically showing an example of a configuration of the sheet and the base secured to the wall surface according to the second exemplary embodiment.

FIG. 15 is a partial sectional view schematically showing an example of a configuration of sheet 500 and base 210 secured to wall surface 400 according to the second exemplary embodiment. FIG. 15 shows a section taken along line XV-XV of FIG. 13.

The following description refers to the flowchart of FIG. 14.

First, sheet 500 is attached to wall surface 400 in a rotatable manner around provisionally fixing part 510 as a central axis (step S11).

In step S11, sheet 500 is disposed in such a manner that back surface 550 of sheet 500 faces wall surface 400 and one end of sheet 500 having provisionally fixing part 510 is positioned vertically upward (in the positive y-direction). Then, sheet 500 is placed on a position where electronic device body 110 is to be attached on wall surface 400, and back surface 550 is brought into contact with wall surface 400. In this state, a stem of a push pin such as a thumbtack (not shown) is inserted in the opening of provisionally fixing part 510 of sheet 500, and the tip of the pin is inserted into wall surface 400. At this condition, the stem of the pin comes into contact with an upper end of the opening of provisionally fixing part 510 (an upper end of protective metal part 530 that covers circumferential edge 540 of provisionally fixing part 510), and thus sheet 500 is hung on the pin. Sheet 500 in this state can rotate in parallel with wall surface 400 (i.e., on the x-y plane) around the upper end of the opening of provisionally fixing part 510 as a central axis. Being protected by protective metal part 530, provisionally fixing part 510 is prevented from being deformed or damaged, although self-weight of sheet 500 is applied to the upper end of the opening of provisionally fixing part 510 in this state of sheet 500. As described above, sheet 500 is attached to wall surface 400 in a rotatable manner around provisionally fixing part 510 as a central axis.

In step S11, sheet 500 is rotatably supported by the pin inserted in wall surface 400 at a point on symmetry axis A. Thus, the gravity acts substantially equally on both sides of symmetry axis A of sheet 500 in a front view (viewed from the z-axis direction). This allows symmetry axis A of sheet 500 to be held in the vertical direction (in a direction parallel to the y-axis), and orthogonal axis B that is orthogonal to symmetry axis A to be held in the horizontal direction (a direction parallel to the x-axis). In this manner, two sheet-openings 520 provided on orthogonal axis B are placed to be level with each other (in parallel with the x-axis).

Then, bases 210 are secured to wall surface 400 at positions corresponding to sheet-openings 520 (step S12).

In step S12, securing surfaces 211 of bases 210 are brought into contact with wall surface 400 through sheet-openings 520 at positions on wall surface 400 where bases 210 respectively reside in sheet-openings 520 as viewed in a direction perpendicular to wall surface 400 (in the z-axis direction), as shown in FIG. 14. In this state, central pin 280 is inserted through central through hole 218 of each of bases 210, and then inserted into wall surface 400. In this manner, bases 210 are provisionally secured to wall surface 400. Then, a plurality of pins 290 (for example, twelve pins 290) are inserted through respective pin holes 222, and then into wall surface 400. In this manner, bases 210 are secured to wall surface 400 at positions corresponding to sheet-openings 520.

Then, sheet 500 is removed from wall surface 400 (step S13).

After two bases 210 have been secured to wall surface 400 in step S12, the pin inserted into wall surface 400 through provisionally fixing part 510 is removed from wall surface 400 in subsequent step S13. Then, sheet 500 is removed from wall surface 400. Sheet-openings 520 have a diameter larger than a diameter of bases 210 in a front view (as viewed from the z-axis direction), and bases 210 can pass through respective sheet-openings 520, so that sheet 500 can be removed from wall surface 400 even after bases 210 have been secured to wall surface 400.

Then, locking part 230 is secured to each of bases 210 (step S14).

In step S14, fitting part 240 of each of locking parts 230 is fitted into corresponding one of bases 210 secured to wall surface 400. Then, a plurality of screws 270 (for example, four screws 270) are respectively turned into screw holes 220 of each of bases 210 through screw-penetrating-holes 250 of locking part 230. In this manner, locking part 230 is secured to each of bases 210.

By fitting locking part 230 to base 210, protrusion 241 of locking part 230 are accommodated in depression 215 of each of bases 210, which prevents coming out of pins 290 that have been inserted in pin holes 222. This configuration makes pins 290 inserted in wall surface 400 much less likely to come out from wall surface 400.

Lastly, electronic device body 110 is attached to attachment devices 200 (step S15).

After locking part 230 has been secured to each of two bases 210 in step S14, electronic device body 110 is brought near to wall surface 400 such that locking part 230 secured to each of bases 210 is partly inserted in corresponding one of main-body-through-holes 130 of electronic device body 110 in subsequent step S15. Then, each of two shafts 140 of electronic device body 110 is fitted into groove 262 of locking part 230. In this manner, electronic device body 110 is attached to two attachment devices 200 secured to wall surface 400 (step S15).

As described above, the method illustrated in the present exemplary embodiment can align and secure two attachment devices 200 to wall surface 400 in the horizontal direction (in the x-axis direction) by utilizing sheet 500. With this configuration, a user can easily secure electronic device 100 to wall surface 400 in a horizontal state.

Note that caps (not shown) to close main-body-through-holes 130 of electronic device body 110 may be attached to main-body-through-holes 130.

[2-3. Effects and Others]

As described above, the method of securing the attachment devices according to the present exemplary embodiment is a method of securing a plurality of attachment devices to a wall surface, each of the attachment devices including: a base having a plurality of pin holes; a plurality of pins that are respectively inserted in the pin holes, and secure the base to the wall surface; and a locking part that is secured to the base, and on which a panel-like electronic device body is to be hung and locked, the method including the steps of: attaching a sheet that has a symmetric shape with respect to a symmetry axis to the wall surface in a rotatable manner around a provisionally fixing part located on the symmetry axis; securing the base to the wall surface at a position corresponding to each of a plurality of sheet-openings provided on the sheet on an orthogonal axis that is orthogonal to the symmetry axis; and securing the locking part to the base.

The sheet according to the present exemplary embodiment is a sheet that is used for securing a plurality of attachment devices to a wall surface, and has a symmetric shape with respect to a symmetry axis. The sheet includes: a provisionally fixing part located on the symmetry axis; and a plurality of sheet-openings located on an orthogonal axis that is orthogonal to the symmetry axis.

Sheet 500 is an example of the sheet. Provisionally fixing part 510 is an example of the provisionally fixing part. Symmetry axis A is an example of the symmetry axis. Orthogonal axis B is an example of the orthogonal axis. Sheet-openings 520 are an example of the sheet-openings. A rectangular shape is an example of the symmetric shape with respect to the symmetry axis.

For example, the method of securing the attachment devices according to the second exemplary embodiment is a method of securing attachment devices 200 (for example, two attachment devices 200) to wall surface 400, each of attachment devices 200 including: base 210 having a plurality of pin holes 222 (for example, twelve pin holes 222); a plurality of pins 290 (for example, twelve pins 290) that are respectively inserted in pin holes 222, and secure base 210 to wall surface 400; and locking part 230 that is secured to base 210, and on which a panel-like electronic device body 110 is to be hung and locked. The method of securing the attachment devices includes the steps of: attaching sheet 500 that is symmetric about symmetry axis A to wall surface 400 in a rotatable manner around provisionally fixing part 510 located on symmetry axis A; securing base 210 to wall surface 400 at a position corresponding to each of a plurality of sheet-openings 520 (for example, two sheet-openings 520) provided on sheet 500 on orthogonal axis B that is orthogonal to symmetry axis A; and securing locking part 230 to base 210.

Sheet 500 according to the second exemplary embodiment is a sheet that is used for securing a plurality of attachment devices 200 (for example, two attachment devices 200) to wall surface 400, and has a symmetric shape about symmetry axis A. Sheet 500 includes: provisionally fixing part 510 located on symmetry axis A; and a plurality of sheet-openings (for example, two sheet-openings) located on orthogonal axis B that is orthogonal to symmetry axis A.

A user of sheet 500 configured as above can easily secure attachment devices 200 at positions parallel to the horizontal direction (the x-axis direction) (i.e., at positions aligned in the horizontal direction) without using an instrument designed to check inclination against a horizontal plane (for example, a level, or a spirit level), at the time of securing a plurality of attachment devices 200 (for example, two attachment devices 200) for attaching electronic device body 110 to wall surface 400. Accordingly, a user can easily attach electronic device body 110 to wall surface 400 in a horizontal state.

In the sheet, each of the sheet-openings may be formed to have a shape that surrounds a base in a front view, the base being included in each of the attachment devices.

For example, in sheet 500 illustrated in the second exemplary embodiment, each of sheet-openings 520 is formed to have a shape that surrounds corresponding one of bases 210 in a front view (as viewed from the z-axis direction).

Since bases 210 can pass through sheet-openings 520 respectively, a user of sheet 500 configured as above can easily remove sheet 500 from wall surface 400 by simply removing the pin that has been inserted into wall surface 400 through provisionally fixing part 510 from wall surface 400 after securing bases 210 (for example, two bases 210) to wall surface 400 (see step S13).

In the sheet, the provisionally fixing part may be located at one end of the sheet on the symmetry axis.

For example, in sheet 500 illustrated in the second exemplary embodiment, provisionally fixing part 510 is located at one end of sheet 500 on symmetry axis A.

In sheet 500 configured as above, the gravity acts substantially equally on both sides of symmetry axis A in a front view (viewed from the z-axis direction) when sheet 500 is supported by the pin inserted into wall surface 400 at a point on symmetry axis A. This makes it easy to hold symmetry axis A in the vertical direction and hold orthogonal axis B that is orthogonal to symmetry axis A in the horizontal direction (a direction parallel to the x-axis). Accordingly, a user can attach electronic device body 110 to wall surface 400 in a horizontal state more easily.

In the sheet, the provisionally fixing part may be an opening provided on the sheet.

For example, in sheet 500 illustrated in the second exemplary embodiment, provisionally fixing part 510 is an opening provided on sheet 500.

In sheet 500 configured as above, a pin can be inserted into wall surface 400 through provisionally fixing part 510. Since circumferential edge 540 of provisionally fixing part 510 is covered by protective metal part 530, friction between the pin inserted into wall surface 400 and provisionally fixing part 510 is reduced, which allows sheet 500 to be hung on the pin in a more rotatable state. With this configuration, symmetry axis A of sheet 500 is more likely to be held in the vertical direction. Accordingly, a user can attach electronic device body 110 to wall surface 400 in a horizontal state more easily.

A shape of the sheet in a front view may be almost identical to a shape of an electronic device body in a front view that is to be secured to the wall surface by using the sheet.

For example, the shape of sheet 500 illustrated in the second exemplary embodiment in a front view (as viewed from the z-axis direction) is almost identical to the shape of electronic device body 110 in a front view (as viewed from the z-axis direction) that is to be secured to wall surface 400 by using sheet 500.

A user of sheet 500 configured as above can visually identify the position of electronic device body 110 on wall surface 400 by simply inserting a pin into wall surface 400 through provisionally fixing part 510 and hanging sheet 500 on the pin. This enables a user to easily determine the position of electronic device body 110 on wall surface 400. Note that "almost identical to" and "substantially the same" described above mean that the shape of sheet 500 in a front view (as viewed from the z-axis direction) is similar to or identical to the shape of electronic device body 110 in a front view (as viewed from the z-axis direction) to a degree where the position of electronic device body 110 on wall surface 400 can be recognized by using sheet 500.

(Another Exemplary Embodiment)

The first and second exemplary embodiments have been described above as being illustrative of the technique disclosed in the present application. However, the technique in the present disclosure is not limited thereto, and can also be applied to exemplary embodiments subjected to alteration, substitution, addition, omission and the like. In addition, a new exemplary embodiment can be made by combining constituent elements described in the foregoing first and second exemplary embodiments.

Hence, another exemplary embodiment is described below.

As another exemplary embodiment, a modification of the base is described below with reference to FIGS. 16 and 17.

Figure 16:
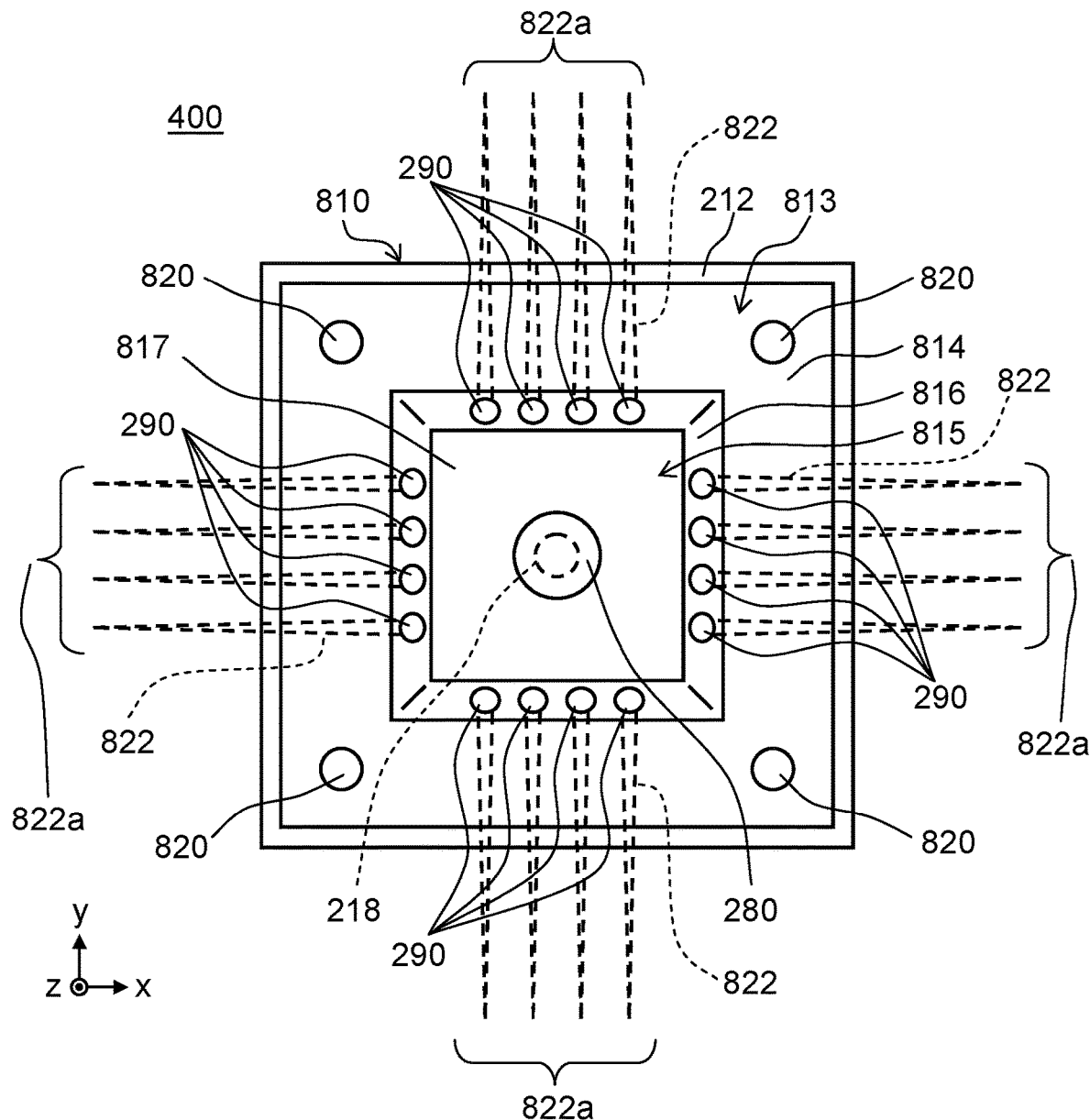
FIG. 16 is a front view schematically showing an example of a base according to a modification of the exemplary embodiments.
Figure 17:
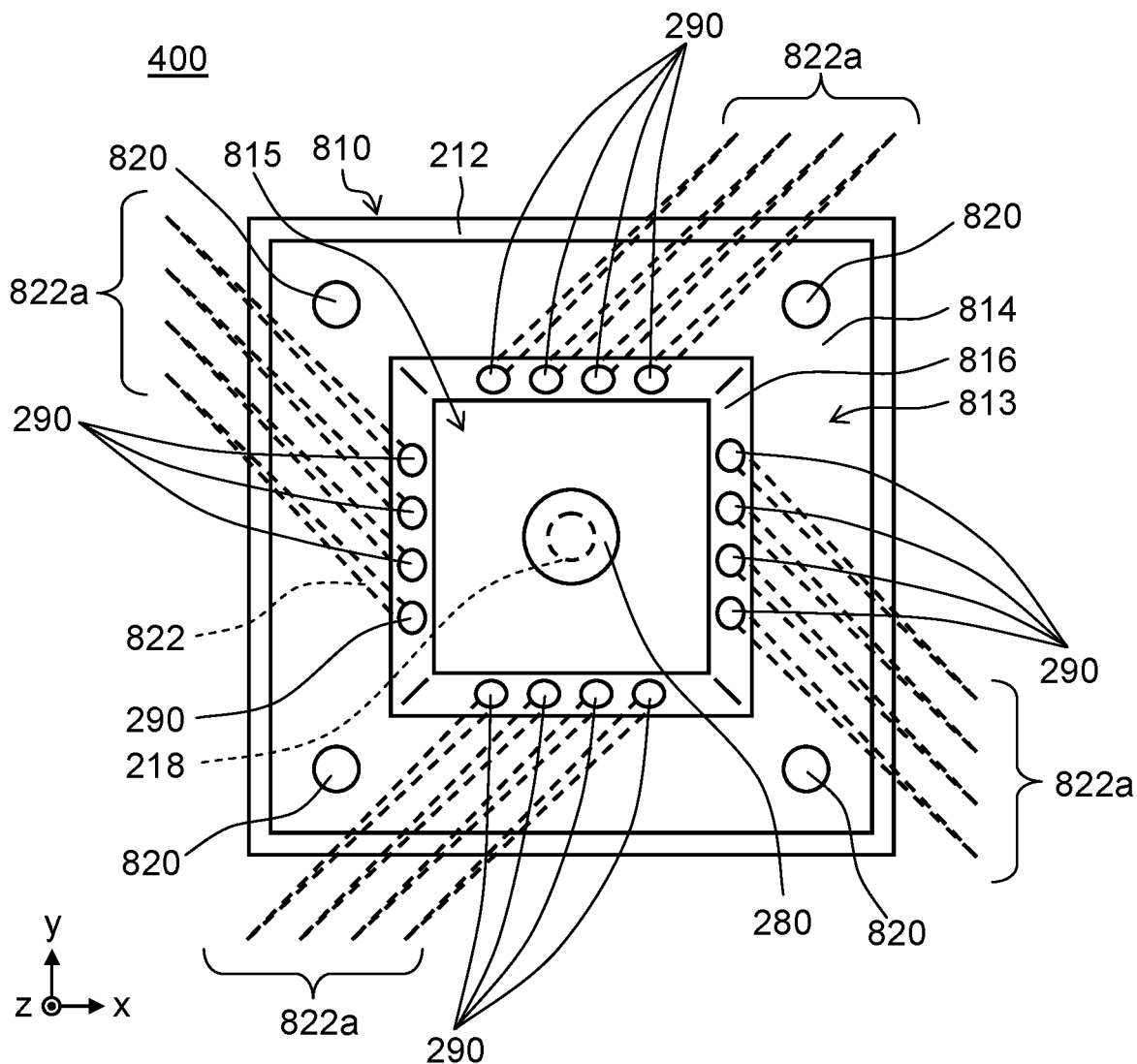
FIG. 17 is a front view schematically showing another example of the base according to the modification of the exemplary embodiments.

FIG. 16 is a front view schematically showing an example of base 810 according to a modification of the exemplary embodiments. FIG. 16 shows a state in which base 810 is secured to wall surface 400. A difference between base 210 illustrated in the first exemplary embodiment and base 810 according to the present modification is described below with reference to FIG. 16. Note that the same reference marks as in the first exemplary embodiment denote substantially the same constituent elements, and a description of the constituent elements will be omitted.

In the first exemplary embodiment, base 210 has a circular shape in a front view (as viewed from the z-axis direction) as a configuration example, but the shape of the base is not limited to a circular shape. The shape of the base in a front view may be a triangle, a quadrilateral, a polygon, an ellipse, or the like. According to the present modification, base 810 is formed in a quadrangular prism having a quadrilateral shape in a front view (as viewed from the z-axis direction) as a configuration example.

Base 810 includes in the middle of front surface 212 depression 813 that is depressed in the negative z-direction in a shape of a quadrangular prism having a quadrilateral shape in a front view (as viewed in the z-axis direction). Base 810 further includes in the middle of bottom surface 814 of depression 813 depression 815 that is depressed in the negative z-direction and has a quadrilateral shape in a front view (as viewed in the z-axis direction). Thus, a side of depression 815 is shorter than a side of depression 813, and bottom surface 817 of depression 815 is located further in the negative z-direction than bottom surface 814 of depression 813.

Depression 815 is formed to have a shape of a quadrilateral truncated cone of which sides gradually decrease from bottom surface 814 toward bottom surface 817 that is closer to securing surface 211 (in the negative z-direction). Thus, four surfaces of peripheral side surface 816 of depression 815 are not perpendicular to, but is inclined with respect to bottom surface 814 (i.e., inclined with respect to the z-axis). The inclination of peripheral side surface 816 with respect to an axis perpendicular to bottom surface 814 (an angle of inclination with respect to the z-axis) is 30 degrees, for example. Note that an angle of inclination of peripheral side surface 816 can be described in the same manner as the angle of inclination of peripheral side surface 216 described in the first exemplary embodiment, and accordingly, a duplicate description is omitted.

Peripheral side surface 816 of depression 815 includes a plurality of pin holes 822 that penetrate from peripheral side surface 816 to securing surface 211 to receive pins 290. According to the present modification, attachment device 200 includes sixteen pins 290, and base 810 includes sixteen pin holes 822. Bottom surface 817 of depression 815 includes at a center thereof central through hole 218 that penetrates from bottom surface 817 to securing surface 211 to receive central pin 280. Bottom surface 814 of depression 813 includes four screw holes 820 at vertexes of the quadrilateral shape having central through hole 218 as a center. Screw holes 820 are respectively arranged near four corners of bottom surface 814.

As shown in FIG. 16, sixteen pin holes 822 included in base 810 are divided into pin hole groups 822a each of which includes four pin holes 822 according to an example illustrated in the present modification. Accordingly, base 810 includes four pin hole groups 822a in an example shown in FIG. 16.

In base 810, one of pin hole groups 822a is disposed on each of the four surfaces of peripheral side surface 816 of base 810. In each of pin hole groups 822a, pin holes 822 are arranged at substantially regular intervals. Pin holes 822 are arranged not to overlap screw holes 820. Specifically, one of pin hole groups 822a is provided to extend in the positive x-direction as shown in FIG. 16, and another one of pin hole groups 822a is provided to extend in the negative x-direction as shown in FIG. 16. A further one of pin hole groups 822a is provided to extend in the positive y-direction as shown in FIG. 16, and a remaining one of pin hole groups 822a is provided to extend in the negative y-direction as shown in FIG. 16. According to the present disclosure, the state in which pin holes 822 are arranged as shown in FIG. 16 is included in the state in which the pin holes are arranged in directions that extend radially from a center of the base.

The configuration of pin holes 822 in the present modification is not limited to the configuration shown in FIG. 16. FIG. 17 is a front view schematically showing another example of base 810 according to the modification of the exemplary embodiments. As shown in FIG. 17, pin holes 822 may have a configuration as described below. One of pin hole groups 822a is provided to extend in a direction at an angle rotated by 45 degrees measured clockwise from the positive x-direction as shown in FIG. 17, and another one of pin hole groups 822a is provided to extend in a direction at an angle rotated by 45 degrees measured clockwise from the negative x-direction as shown in FIG. 17. A further one of pin hole groups 822a is provided to extend in a direction at an angle rotated by 45 degrees measured clockwise from the positive y-direction as shown in FIG. 17, and a remaining one of pin hole groups 822a is provided to extend in a direction at an angle rotated by 45 degrees measured clockwise from the negative y-direction as shown in FIG. 17.

In this manner, pin holes 822 may extend in at least four directions outwardly from base 810. According to the present disclosure, the state in which pin holes 822 are arranged as shown in FIG. 17 is also included in the state in which the pin holes are arranged in directions that extend radially from a center of the base.

In locking part 230 that is to be fitted to base 810, it is desirable that each of fitting part 240 and protrusion 241 are formed to have a shape corresponding to base 810. Sheet-openings 520 may be formed to have a shape corresponding to base 810.

In the exemplary embodiments, electronic device 100 includes two attachment devices 200 as a configuration example, the number of attachment device 200 included in electronic device 100 is not limited to two. Electronic device 100 may include one attachment device 200 or three or more attachment devices 200. In the case where electronic device 100 includes one attachment device 200, electronic device body 110 is desirably hung and locked on attachment device 200 substantially at the middle in the horizontal direction (in the x-axis direction) of electronic device body 110. In the case where electronic device 100 includes three or more attachment devices 200, attachment devices 200 are desirably secured to wall surface 400 at regular intervals in the horizontal direction (in the x-axis direction) in view of load-bearing capacity.

In the exemplary embodiments, the predetermined angle θ is desirably equal to or greater than 20 degrees and less than or equal to 40 degrees, but the predetermined angle θ is not limited to these values. The predetermined angle θ that is an angle of pin holes 222 with respect to wall surface 400 may be less than 20 degrees or greater than 40 degrees as long as pin holes 222 are provided outwardly from base 210.

In the exemplary embodiments, each of attachment devices 200 includes twelve pin holes 222 as a configuration example. In the modification, each of attachment devices 200 includes sixteen pin holes 822 as a configuration example. However, a number of pin holes 222 (or pin holes 822) included in each of attachment devices 200 is not limited to these values. The number of pin holes 222 (or pin holes 822) included in each of attachment devices 200 may be set appropriately according to the weight of electronic device body 110 supported by attachment devices 200 (i.e., load-bearing capacity required for each of attachment devices 200). A number of pins 290 may be set according to a number of pin holes 222 (or pin holes 822).

In the exemplary embodiments, electronic device body 110 includes shaft 140 and each of attachment devices 200 includes groove 262 as a configuration example, but configurations of electronic device body 110 and attachment devices 200 are not limited thereto. For example, electronic device body 110 may include groove 262, and each of attachment devices 200 may include shaft 140. In such a case, groove 262 of electronic device body 110 is configured to include a groove that is not depressed downwardly (in the negative y-direction) but depressed upwardly (in the positive y-direction).

In the exemplary embodiments, groove 262 includes projection 263, and inside surface 264 of groove 262 includes an arc-shaped portion in a sectional side view of groove 262 (in a sectional shape as viewed in the x-axis direction) as a configuration example, but a configuration of groove 262 is not limited thereto. Groove 262 may not include projection 263. Inside surface 264 of groove 262 may not include an arc-shaped portion but may be formed of only a linear shape in a sectional side view of groove 262 (in a sectional shape as viewed in the x-axis direction).

In the exemplary embodiments, electronic device body 110 includes main-body-through-holes 130 as a configuration example, but electronic device body 110 may not include main-body-through-hole 130. Electronic device body 110 may include shaft 140 and shaft holders 150 on a surface of an exterior of electronic device body 110. Electronic device body 110 may include an opening on main-body-back-surface 121 of electronic device body 110 and include shaft 140 and shaft holders 150 in the opening. In other words, electronic device body 110 may have a configuration not to include an opening on main-body-front-surface 120.

In the exemplary embodiments, attachment devices 200 each include central pin 280 as a configuration example, but attachment devices 200 may not include central pin 280. In such a case, each of attachment devices 200 may not be provisionally fixed by central pin 280, but may be provisionally fixed by one of pins 290. In the case where attachment devices 200 each do not include central pin 280, base 210 of each of attachment devices 200 may not include central through hole 218.

In the exemplary embodiments, central pin 280 used for provisional fixing is not removed from base 210 even after base 210 is secured to wall surface 400 as a configuration example. However, central pin 280 may be removed from base 210 after base 210 is secured to wall surface 400 with pins 290.

In the exemplary embodiments, each of sheet-openings 520 has a shape that surrounds base 210 in a front view (as viewed from the z-axis direction) as a configuration example, but a shape of each of sheet-openings 520 is not limited thereto. Each of sheet-openings 520 has a circular shape in a front view (as viewed from the z-axis direction) as a configuration example, but the shape of sheet-openings 520 is not limited to a circular shape and may have any shape. An opening of provisionally fixing part 510 has a circular shape in a front view (as viewed from the z-axis direction) as a configuration example, but a shape of the opening of provisionally fixing part 510 is not limited to a circular shape and may have any shape.

In the exemplary embodiments, provisionally fixing part 510 is located on symmetry axis A at one end of sheet 500 as a configuration example, but a position of provisionally fixing part 510 is not limited to one end of sheet 500 and may be any position on symmetry axis A.

In the exemplary embodiments, provisionally fixing part 510 is an opening as a configuration example, but provisionally fixing part 510 may not be an opening. Provisionally fixing part 510 may be a sign (a mark) formed on symmetry axis A of sheet 500 by printing or the like. The sign may have a dotted shape or a linear shape along symmetry axis A, for example. In the case where sheet 500 includes such a sign as provisionally fixing part 510, a drawing pin such as a thumbtack may be inserted in a point on provisionally fixing part 510 of sheet 500, so that the pin is inserted through sheet 500 to secure sheet 500 to wall surface 400, in step S11 shown in FIG. 14. In such a case, a center of provisionally fixing part 510 may not a central axis of rotation of sheet 500 (rotation of sheet 500 parallel to wall surface 400, i.e., rotation of sheet 500 on the x-y plane). As described in the exemplary embodiments, the upper end of the opening of provisionally fixing part 510 may be the central axis of the rotation of sheet 500. In other words, the central axis of the rotation of sheet 500 is not limited as long as being included in provisionally fixing part 510.

In the exemplary embodiments, the shape of sheet 500 in a front view (as viewed from the z-axis direction) is substantially the same as the shape of electronic device body 110 in a front view (as viewed from the z-axis direction) as a configuration example, but is not limited thereto. The shape of sheet 500 in a front view may not be the same as the shape of electronic device body 110 in a front view. However, it is desirable that a width in the horizontal direction (in the x-axis direction) of sheet 500 is substantially the same as a width of electronic device body 110 in the horizontal direction (in the x-axis direction). With this configuration, a distance between attachment devices 200 in the horizontal direction (in the x-axis direction) (or positions to locate attachment devices 200 in the horizontal direction (the x-axis direction)) can correspond to main-body-through-holes 130 included in electronic device body 110. A shape of sheet 500 is not limited to a rectangular shape. The shape of sheet 500 may be a rectangular shape or any other shape (for example, a polygon or the like) that is symmetric with respect to symmetry axis A.

In the exemplary embodiments, the pin inserted in wall surface 400 through provisionally fixing part 510 is removed from wall surface 400, and then sheet 500 is removed from wall surface 400 in step S13 shown in FIG. 14 as an operation example, but the present disclosure is not limited to this operation. For example, the pin may be remained inserted in wall surface 400 and sheet 500 may be remained secured to wall surface 400. In such a case, sheet 500 is sandwiched between electronic device body 110 and wall surface 400. Accordingly, when sheet 500 is formed of a material with a heat dispersing property, sheet 500 that is sandwiched between electronic device body 110 and wall surface 400 can be used as a heat dispersion member to disperse heat generated by electronic device body 110 toward wall surface 400.

In the exemplary embodiments, sheet 500 includes two sheet-openings 520 as a configuration example, a number of sheet-openings 520 included in sheet 500 is not limited to two. In the case where electronic device body 110 includes three or more main-body-through-holes 130, sheet 500 may include three or more sheet-openings 520 according to the number and the positions of main-body-through-holes 130. The number and the positions of sheet-openings 520 included in sheet 500 may be set according to the number and the positions of main-body-through-holes 130 included in electronic device body 110. In the case where sheet 500 includes three or more sheet-openings 520, it is desirable that sheet-openings 520 be located on orthogonal axis B that is orthogonal to symmetry axis A on sheet 500 at regular intervals in view of the load-bearing capacity of each of attachment devices 200.

In the exemplary embodiments, electronic device body 110 is a television set as a configuration example, but electronic device body 110 is not limited to a television set. Electronic device body 110 may be a panel-like electronic device body, such as a display device without a tuner or a receiver, audio equipment, and a digital photo frame.

The exemplary embodiments have been described as examples of the technique in the present disclosure. The accompanying drawings and the detailed description have been provided for this purpose.

For illustration of the above technique, the constituent elements illustrated and described in the accompanying drawings and the detailed description may include not only the constituent elements that are essential for solving the problem but also constituent elements that are not essential for solving the problem. These non-essential constituent elements therefore should not be instantly construed as being essential, based on the fact that the non-essential constituent elements are illustrated and described in the accompanying drawings and the detailed description.

The above exemplary embodiments are provided to exemplify the technique according to the present disclosure, and various changes, replacements, additions, omissions, and the like can be made within the scope of the claims and equivalents thereof.

INDUSTRIAL APPLICABILITY

The present disclosure is applicable to an electronic device that can be hung on the wall. Specifically, the present disclosure is applicable to a panel-like electronic device that can be hung on a wall, such as a wall-mountable flat television set.

REFERENCE MARKS IN THE DRAWINGS

100: electronic device
110: electronic device body
120: main-body-front-surface
121: main-body-back-surface
130: main-body-through-hole
140: shaft
150: shaft holder
200: attachment device
210, 810: base
211: securing surface
212, 245: front surface
213, 215, 243, 813, 815: depression
216, 261, 816: peripheral side surface
217, 214, 814, 817: bottom surface
218: central through hole
220, 820: screw hole
222, 822: pin hole
222a, 822a: pin hole group
230: locking part
240: fitting part
241, 260: protrusion
242: protruding surface
246: back surface
250: screw-penetrating-hole
262: groove
263: projection
264: inside surface
270: screw
280: central pin
290: pin
400: wall surface
500: sheet
510: provisionally fixing part
520: sheet-opening
530: protective metal part
540: circumferential edge
550: back surface
A: symmetry axis
B: orthogonal axis
θ: predetermined angle

The invention claimed is:

1. An attachment device for attaching an electronic device body to a wall surface, the attachment device comprising:
   a base having a plurality of pin holes;
   a plurality of pins that are respectively inserted in the plurality of pin holes, and secure the base to the wall surface; and
   a locking part that is secured to the base, and on which the electronic device body is to be hung and locked, wherein:
   the base includes a securing surface that is a surface to be secured to the wall surface,
   the base includes a recess having an inner wall,
   the plurality of pin holes are disposed on the inner wall and respectively arranged outwardly from the base at a predetermined angle with respect to the securing surface,
   the locking part includes a groove and a projection,
   the groove is configured to receive a shaft that is included in the electronic device body and extends in a horizontal direction in a state in which the electronic device body is attached to the wall surface,
   the projection is positioned above the shaft in a state in which the electronic device body including the shaft is attached to the wall surface, and
   the projection protrudes over the groove from a portion closer to the base than a distal end of the locking part which is farther from the base than an proximal end of the locking part facing the base.

2. The attachment device according to claim 1, wherein:
   each of the pin holes has an outlet opening disposed on the securing surface and an inlet opening,
   the inlet opening and the outlet opening of each of the pin holes are arranged in a direction that radially extends from a center of the base to the outlet opening via the inlet opening.

3. The attachment device according to claim 1, wherein the predetermined angle is equal to or greater than 20 degrees and less than or equal to 40 degrees.

4. The attachment device according to claim 1, wherein an inside surface of the groove includes an arc-shaped portion in a sectional view.

5. An electronic device comprising:
   the attachment device defined in claim 1; and
   the electronic device body including the shaft.

6. The electronic device according to claim 5, wherein the electronic device body includes a main-body-through-hole that is a through hole in which at least part of the locking part is inserted.

* * * * *